United States Patent
Laporte et al.

(10) Patent No.: US 9,252,718 B2
(45) Date of Patent: *Feb. 2, 2016

(54) LOW COMPLEXITY DIGITAL PREDISTORTION FOR CONCURRENT MULTI-BAND TRANSMITTERS

(71) Applicant: Telefonaktiebolaget L M Ericsson (publ), Stockholm (SE)

(72) Inventors: Pierre-Andre Laporte, Gatineau (CA); Haiying Cao, Solna (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 121 days.

This patent is subject to a terminal disclaimer.

(21) Appl. No.: 13/969,858

(22) Filed: Aug. 19, 2013

(65) Prior Publication Data

US 2014/0347126 A1 Nov. 27, 2014

Related U.S. Application Data

(60) Provisional application No. 61/826,060, filed on May 22, 2013.

(51) Int. Cl.
*H04B 1/04* (2006.01)
*H04M 1/00* (2006.01)
(Continued)

(52) U.S. Cl.
CPC ............ *H03F 1/3241* (2013.01); *H03F 1/3247* (2013.01); *H04B 1/0067* (2013.01); *H04B 1/0475* (2013.01); *H04B 1/0483* (2013.01);
(Continued)

(58) Field of Classification Search
CPC ...... H04B 1/0053; H04B 1/04; H04B 1/0425; H04B 1/0433; H04B 1/0475; H04B 1/0483; H04B 1/40; H04B 1/62; H04B 17/13; H04L 27/367; H04L 27/368

USPC ............ 455/63.1, 67.13, 114.2, 114.3, 127.2, 455/552.1; 375/296, 297
See application file for complete search history.

(56) References Cited

U.S. PATENT DOCUMENTS 6,057,793 A 5/2000 Gong et al.
6,125,266 A 9/2000 Matero et al.
(Continued)

FOREIGN PATENT DOCUMENTS

EP 2369362 A1 9/2011
WO 2010136114 A1 12/2010

OTHER PUBLICATIONS

International Search Report and Written Opinion for PCT/IB2014/061160, mailed Nov. 28, 2014, 16 pages.
(Continued)

*Primary Examiner* — Quochien B Vuong
(74) *Attorney, Agent, or Firm* — Withrow & Terranova, PLLC

(57) ABSTRACT

Systems and methods are disclosed for digital predistortion for a concurrent multi-band transmitter using a single adaptor and a same set of predistortion coefficients for separate digital predistorters for each band. In one embodiment, the single adaptor is configured to adaptively configure a set of predistortion coefficients based on a memory polynomial digital baseband model of the digital predistorters having a same set of predistortion coefficients for each of the digital predistorters. By using the same set of predistortion coefficients for the separate digital predistorters for each band, a complexity of the digital predistortion is substantially reduced.

18 Claims, 10 Drawing Sheets

(51) Int. Cl.
*H03F 1/32* (2006.01)
*H04B 1/00* (2006.01)

(52) U.S. Cl.
CPC ... *H03F 2200/111* (2013.01); *H04B 2001/0425* (2013.01); *H04B 2001/0433* (2013.01)

(56) References Cited

U.S. PATENT DOCUMENTS

| | | | |
|---|---|---|---|
| 6,452,982 | B1 | 9/2002 | O'Dell et al. |
| 6,549,067 | B1 | 4/2003 | Kenington |
| 6,956,433 | B2 | 10/2005 | Kim et al. |
| 6,999,523 | B2 | 2/2006 | Posti |
| 7,136,430 | B2 | 11/2006 | Morris et al. |
| 7,170,342 | B2 | 1/2007 | Suzuki et al. |
| 7,170,344 | B2 | 1/2007 | Suzuki et al. |
| 7,183,847 | B2 | 2/2007 | Suzuki et al. |
| 7,236,110 | B2 | 6/2007 | Antonesei |
| 7,466,247 | B1 | 12/2008 | Gorbics |
| 7,539,464 | B2 | 5/2009 | Suzuki et al. |
| 7,634,238 | B2 | 12/2009 | Suzuki et al. |
| 7,848,717 | B2 | 12/2010 | Liu |
| 8,149,950 | B2 | 4/2012 | Kim et al. |
| 8,289,195 | B1 | 10/2012 | Dong et al. |
| 8,351,877 | B2 * | 1/2013 | Kim et al. .................. 455/114.3 |
| 8,380,144 | B1 | 2/2013 | Bai et al. |
| 8,391,809 | B1 | 3/2013 | Fuller |
| 8,416,111 | B2 | 4/2013 | Pagnanelli |
| 2003/0053552 | A1 | 3/2003 | Hongo et al. |
| 2003/0053558 | A1 | 3/2003 | Unger et al. |
| 2005/0160124 | A1 | 7/2005 | Bisiaux |
| 2010/0098191 | A1 | 4/2010 | Morris et al. |
| 2010/0316157 | A1 | 12/2010 | Bassam et al. |
| 2011/0235749 | A1 | 9/2011 | Kenington |
| 2012/0069931 | A1 | 3/2012 | Gandhi et al. |
| 2012/0154038 | A1 | 6/2012 | Kim et al. |
| 2012/0328050 | A1 | 12/2012 | Bai et al. |
| 2013/0094610 | A1 | 4/2013 | Ghannouchi et al. |
| 2013/0241757 | A1 | 9/2013 | Morris |
| 2014/0009225 | A1 | 1/2014 | Laporte |
| 2014/0219392 | A1 | 8/2014 | Chen et al. |

OTHER PUBLICATIONS

International Search Report and Written Opinion for PCT/IB2014/061161, mailed Nov. 26, 2014, 17 pages.
Kim, Jiwoo et al., "A Generalized Architecture for the Frequency-Selective Digital Predistortion Linearization Technique," IEEE Transactions on Microwave Theory and Techniques, vol. 61, No. 1, Jan. 2013, IEEE, pp. 596-605.
Invitation to Pay Additional Fees and Partial International Search for PCT/IB2014/061160, mailed Sep. 18, 2014, 7 pages.
Invitation to Pay Additional Fees and Partial International Search for PCT/IB2014/061161, mailed Sep. 18, 2014, 9 pages.
Bassam, Seyed Aidin et al., "2-D Digital Predistortion (2-D-DPD) Architecture for Concurrent Dual-Band Transmitters," IEEE Transactions on Microwave Theory and Techniques, vol. 59, No. 10, Oct. 2011, pp. 2547-2553.
Bassam, Seyed Aidin et al., "Channel-Selective Multi-Cell Digital Predistorter for Multi-Carrier Transmitters," IEEE Transactions on Communications, vol. 60, No. 8, Aug. 2012, pp. 2344-2352.
Caffee, Sean, "Continuously Variable Fractional Rate Decimator," XILINX XAPP936, v1.1, Mar. 5, 2007, pp. 1-11.
Cidronali, A. et al., "A New Approach for Concurrent Dual-Band IF Digital PreDistortion: System Design and Analysis," Workshop on Integrated Nonlinear Microwave and Millimetre-Wave Circuits, Nov. 24-25, 2008, 4 pages, Malaga, Spain.
Cidronali, Alessandro et al., "Dual-Band Power Amplifiers for WiMAX and WCDMA Applications," Target Day Programme 2007, Dec. 17, 2007, 51 pages, Florence, Italy.
Ding, Lei et al., "Concurrent Dual-band Digital Predistortion," 2012 IEEE MTT-S International Microwave Symposium Digest (MTT), Jun. 17-22, 2012, 3 pages, Montreal, Canada.
Jiang, Hong et al., "Digital Predistortion Using Stochastic Conjugate Gradient Method," IEEE Transactions on Broadcasting, vol. 58, No. 1, Mar. 2012, pp. 114-124.
Kim, J. et al., "Digital predistortion of wideband signals based on power amplifier model with memory," Electronics Letters, vol. 37, No. 23, Nov. 8, 2001, pp. 1417-1418.
Liu, Y.-J. et al., "2D augmented Hammerstein model for concurrent dual-band power amplifiers," Electronics Letters, vol. 48, No. 19, Sep. 13, 2012, 2 pages.
Liu, Y.-J. et al., "Low-complexity 2D behavioural model for concurrent dual-band power amplifiers," Electronics Letters, vol. 48, No. 11, May 24, 2012, 2 pages.
Liu, You-Jiang et al., "Behavioral Modeling for Concurrent Dual-band Power Amplifiers Using 2D Hammerstein/Wiener Models," International Journal of RF and Microwave Computer-Aided Engineering, vol. 23, No. 6, Nov. 14, 2013, 9 pages.
Liu, You-Jiang et al., "Digital Predistortion for Concurrent Dual-Band Transmitters Using 2-D Modified Memory Polynomials," IEEE Transactions on Microwave Theory and Techniques, vol. 61, No. 1, Jan. 2013, pp. 281-290.
Younes, Mayada et al., "An Accurate Complexity-Reduced "Plume" Model for Behavioral Modeling and Digital Predistortion of RF Power Amplifiers," IEEE Transactions on Industrial Electronics, vol. 58, No. 4, Apr. 2011, pp. 1397-1405.
Younes, Mayada et al., "On the Modeling and Linearization of a Concurrent Dual-Band Transmitter Exhibiting Nonlinear Distortion and Hardware Impairments," IEEE Transactions on Circuits and Systems—I: Regular Papers, vol. 60, No. 11, Nov. 2013, pp. 3055-3068.
Notice of Allowance for U.S. Appl. No. 13/249,319, mailed Nov. 9, 2012, 8 pages.
Non-Final Office Action for U.S. Appl. No. 14/093,755, mailed Apr. 9, 2015, 11 pages.
International Preliminary Report on Patentability for PCT/IB2014/061160, mailed Dec. 3, 2015, 11 pages.
International Preliminary Report on Patentability for PCT/IB2014/061161, mailed Dec. 3, 2015, 12 pages.
Non-Final Office Action for U.S. Appl. No. 14/093,755, mailed Aug. 24, 2015, 11 pages.

* cited by examiner

LOW COMPLEXITY DIGITAL PREDISTORTION FOR CONCURRENT MULTI-BAND TRANSMITTERS

RELATED APPLICATIONS

This application claims the benefit of provisional patent application Ser. No. 61/826,060, filed May 22, 2013, the disclosure of which is hereby incorporated herein by reference in its entirety.

FIELD OF THE DISCLOSURE

The present disclosure relates to digital predistortion for a concurrent multi-band transmitter.

BACKGROUND

In many modern applications, there is a desire for concurrent multi-band transmitters that are capable of transmitting concurrent multi-band signals. As used herein, a concurrent multi-band signal is a signal that occupies multiple distinct frequency bands. More specifically, a concurrent multi-band signal contains frequency components occupying a different continuous bandwidth for each of multiple frequency bands. The concurrent multi-band signal contains no frequency components between adjacent frequency bands. One example of a concurrent multi-band signal is a concurrent dual-band signal. One exemplary application for concurrent multi-band signals that is of particular interest is a multi-standard cellular communications system. A base station in a multi-standard cellular communications system may be required to simultaneously, or concurrently, transmit multiple signals for multiple different cellular communications protocols or standards (i.e., transmit a multi-band signal). Similarly, in some scenarios, a base station in a Long Term Evolution (LTE) cellular communications protocol may be required to simultaneously transmit signals in separate frequency bands.

A concurrent multi-band transmitter includes a multi-band power amplifier that operates to amplify a concurrent multi-band signal to be transmitted to a desired power level. Like their single-band counterparts, multi-band power amplifiers are configured to achieve maximum efficiency, which results in poor linearity. For single-band transmitters, digital predistortion of a digital input signal of the single-band transmitter is typically used to predistort the digital input signal using an inverse model of the nonlinearity of the power amplifier to thereby compensate, or counter-act, the nonlinearity of the power amplifier. By doing so, an overall response of the single-band transmitter is linearized.

One issue with concurrent multi-band transmitters is that conventional single-band digital predistortion techniques cannot be used. Specifically, as an example, a concurrent dual-band transmitter exhibits three types of intermodulation products at the output of the concurrent dual-band transmitter, as illustrated in FIG. 1. The first type of intermodulation products consist of intermodulation products around each carrier frequency ($\omega_1$ and $\omega_2$) that are solely due to the intermodulation between signal elements within each band, which is similar to what is found in a single-band transmitter and is referred to as in-band intermodulation. The second type of intermodulation products consist of intermodulation products that appear in the same frequency range as the in-band intermodulation but are the result of intermodulation products between signal elements in both frequency bands (i.e., both the frequency band centered at $\omega_1$ and the frequency band centered at $\omega_2$). This second type of intermodulation products is referred to as cross-modulation. Lastly, the third type of intermodulation products consist of intermodulation products between the two signals in both frequency bands that are located at $\Delta\omega$ away from the lower and upper carrier frequencies. This third type of intermodulation products is referred to as out-of-band intermodulation.

Typically, the out-of-band intermodulation can be removed via filtering at the output of the power amplifier and, as such, can be ignored. However, the issue with the concurrent dual-band transmitter is that conventional single-band digital predistortion techniques cannot practically be used to compensate for both in-band intermodulation and cross-modulation. Specifically, treating the digital input signals of the concurrent dual-band transmitter as a single-band digital input signal and using a single digital predistorter to compensate for both in-band intermodulation and cross-modulation requires observing a bandwidth at the output of the concurrent dual-band transmitter that is extremely wide. As a result, a required sampling rate for Analog-to-Digital (A/D) conversion and the digital circuitry is too high for a practical implementation. Conversely, using two separate signal-band predistorters to independently compensate for distortion in each frequency band is insufficient because this approach does not compensate for cross-modulation.

In order to address these issues, a Dual-Band Digital Predistortion technique (referred to as 2D-DPD) was proposed in Bassam S. et al., "2-D Digital Predistortion (2D-DPD) Architecture for Concurrent Dual-Band Transmitter," IEEE Transactions on Microwave Theory and Technique, Vol. 59, No. 10, October 2011, pp. 2547-2553. The 2D-DPD technique relies on separate predistorters and separate adaptors for each band. In particular, the 2D-DPD technique uses the following baseband model for the separate predistorters:

$$y_1(n) = \sum_{m=0}^{M-1}\sum_{k=0}^{N-1}\sum_{j=0}^{k} c_{k,j,m}^{(1)} x_1(n-m)|x_1(n-m)|^{k-j}|x_2(n-m)|^j \quad (1)$$

$$y_2(n) = \sum_{m=0}^{M-1}\sum_{k=0}^{N-1}\sum_{j=0}^{k} c_{k,j,m}^{(2)} x_2(n-m)|x_2(n-m)|^{k-j}|x_1(n-m)|^j \quad (2)$$

where $y_i(n)$ is the predistorted output signal of the digital predistorter for band i (i=1, 2 for the concurrent dual-band transmitter), M represents a memory depth of the 2D-DPD baseband model, N is the nonlinear order of the 2D-DPD baseband model (i.e., an order of nonlinearity compensated for by the digital predistorters), $c_{k,j,m}^{(i)}$ are complex valued predistortion coefficients for the digital predistorter for band i that are configured by a corresponding adaptor for band i, $x_1$ is the digital input signal for the first band, and $x_2$ is the input signal for the second band.

One issue with the 2D-DPD technique is that the 2D-DPD baseband model of Equations (1) and (2) requires a large number of predistortion coefficients $c_{k,j,m}^{(i)}$ to be adaptively configured by the corresponding adaptors. Specifically, since there are three summations, the number of predistortion coefficients $c_{k,j,m}^{(i)}$ required by the 2D-DPD baseband model is M(K+1)(K+2). The large number of predistortion coefficients results in a high complexity, and thus high cost, DPD architecture.

In You-Jiang Liu et al., "Digital Predistortion for Concurrent Dual-Band Transmitters Using 2-D Modified Memory Polynomials," IEEE Transactions on Microwave Theory and Techniques, Vol. 61, No. 1, January 2013, pp. 281-290 and You-Jiang Liu et al., "Low-complexity 2D behavioural model for concurrent dual-band power amplifiers," Electronic Letters, Vol. 48, No. 11, May 2012, a 2D-Modified Memory Polynomial (2D-MMP) baseband model was proposed that reduces the number of predistortion coefficients. Like the 2D-DPD baseband model, the 2D-MMP baseband model relies on separate predistorters and separate adaptors for each frequency band. In particular, the 2D-MMP baseband model is defined as:

$$y_1(n) = \sum_{m=0}^{M-1}\sum_{k=0}^{N-1} c_{k,m}^{(1)} x_1(n-m) \||x_1(n-m)|+jb_{k+1}^{(1)}|x_2(n-m)|\|^k \quad (3)$$

$$y_2(n) = \sum_{m=0}^{M-1}\sum_{k=0}^{N-1} c_{k,m}^{(2)} x_2(n-m) \||x_2(n-m)|+jb_{k+1}^{(2)}|x_1(n-m)|\|^k \quad (4)$$

where $b_{k+1}^{(i)}$ pre-calculated (k+1)-th order envelope coupling factors between $x_1$ and $x_2$.

While the 2D-MMP baseband model results in a reduction in the number of predistortion coefficients, a baseband model for dual-band, or more generally multi-band, digital predistortion having a further reduction in the number of predistortion coefficients and thus complexity is desired.

SUMMARY

The present disclosure relates to digital predistortion for a concurrent multi-band transmitter that utilizes a single adaptor and a same set of predistortion coefficients to configure separate digital predistorters for each band. In one embodiment, the single adaptor is configured to adaptively configure a set of predistortion coefficients based on a memory polynomial digital baseband model of the digital predistorters having a same set of predistortion coefficients for each of the digital predistorters. By using the same set of predistortion coefficients for the separate digital predistorters for each band, a complexity of the digital predistortion is substantially reduced.

In one embodiment, a concurrent multi-band transmitter includes a digital predistortion subsystem, power amplifier circuitry, and a single adaptor. The digital predistortion subsystem includes multiple digital predistorters configured to process multiple digital input signals for multiple frequency bands of a concurrent multi-band signal to provide corresponding predistorted digital input signals. Each of the digital predistorters is configured to process the digital input signals based on a set of predistortion coefficients to provide a predistorted digital input signal for a different one of the frequency bands of the concurrent multi-band signal. The concurrent multi-band transmitter also includes circuitry configured to process the predistorted digital input signals to provide a predistorted concurrent multi-band signal. The power amplifier circuitry is configured to amplify the predistorted concurrent multi-band signal to provide the concurrent multi-band signal. The single adaptor is configured to adaptively configure the set of predistortion coefficients for each of the plurality of digital predistorters based on a memory polynomial digital baseband model of the digital predistorters having a same set of predistortion coefficients for each of the digital predistorters. In this manner, the number of predistortion coefficients required by the memory polynomial baseband model, and thus the complexity of the concurrent multi-band transmitter, is substantially reduced.

In one embodiment, the digital input signals of the concurrent multi-band transmitter are digital baseband input signals, and the concurrent multi-band transmitter includes combiner circuitry configured to combine the digital baseband input signals to provide a combined reference signal for the single adaptor such that, in the combined reference signal, frequency bands of the digital baseband input signals overlap. Further, in one embodiment, the concurrent multi-band transmitter includes an observation receiver configured to process the concurrent multi-band signal output by the power amplifier circuitry to provide a combined feedback signal in which each frequency band of the concurrent multi-band signal is downconverted to baseband. As such, in the combined feedback signal, frequency bands of the concurrent multi-band signal overlap. In this manner, a bandwidth of the combined feedback signal is substantially less than a bandwidth of the concurrent multi-band signal output by the power amplifier circuitry and, as such, a sampling rate requirement for Analog-to-Digital (A/D) conversion is substantially reduced. The single adaptor configures the set of predistortion coefficients based on the combined reference signal and the combined feedback signal.

In another embodiment, the concurrent multi-band transmitter includes tuning circuitry configured to tune each of the digital input signals to a different intermediate frequency and combiner circuitry configured to combine the tuned digital input signals to provide a combined reference signal. Further, in one embodiment, the concurrent multi-band transmitter includes an observation receiver configured to process the concurrent multi-band signal output by the power amplifier circuitry to provide a combined feedback signal in which each frequency band of the concurrent multi-band signal is tuned to a same intermediate frequency as a corresponding one of the digital input signals in the combined reference signal. In one embodiment, the intermediate frequencies are selected such that there is sufficient separation in the intermediate frequencies to avoid overlap of the frequency bands of the concurrent multi-band signal in the combined feedback signal for at least up to a predefined maximum order of nonlinearity for which the digital predistorters compensate while also reducing a bandwidth of the combined feedback signal as compared to that of the concurrent multi-band signal. The single adaptor configures the set of predistortion coefficients based on the combined reference signal and the combined feedback signal.

In one embodiment, the digital predistortion subsystem includes a number of additional digital predistorters that compensate for Third-Order Intermodulation (IM3) frequency bands. The memory polynomial baseband model is further defined such that each of the additional predistorters are also configured with the same set of predistortion coefficients as the digital predistorters.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 3:
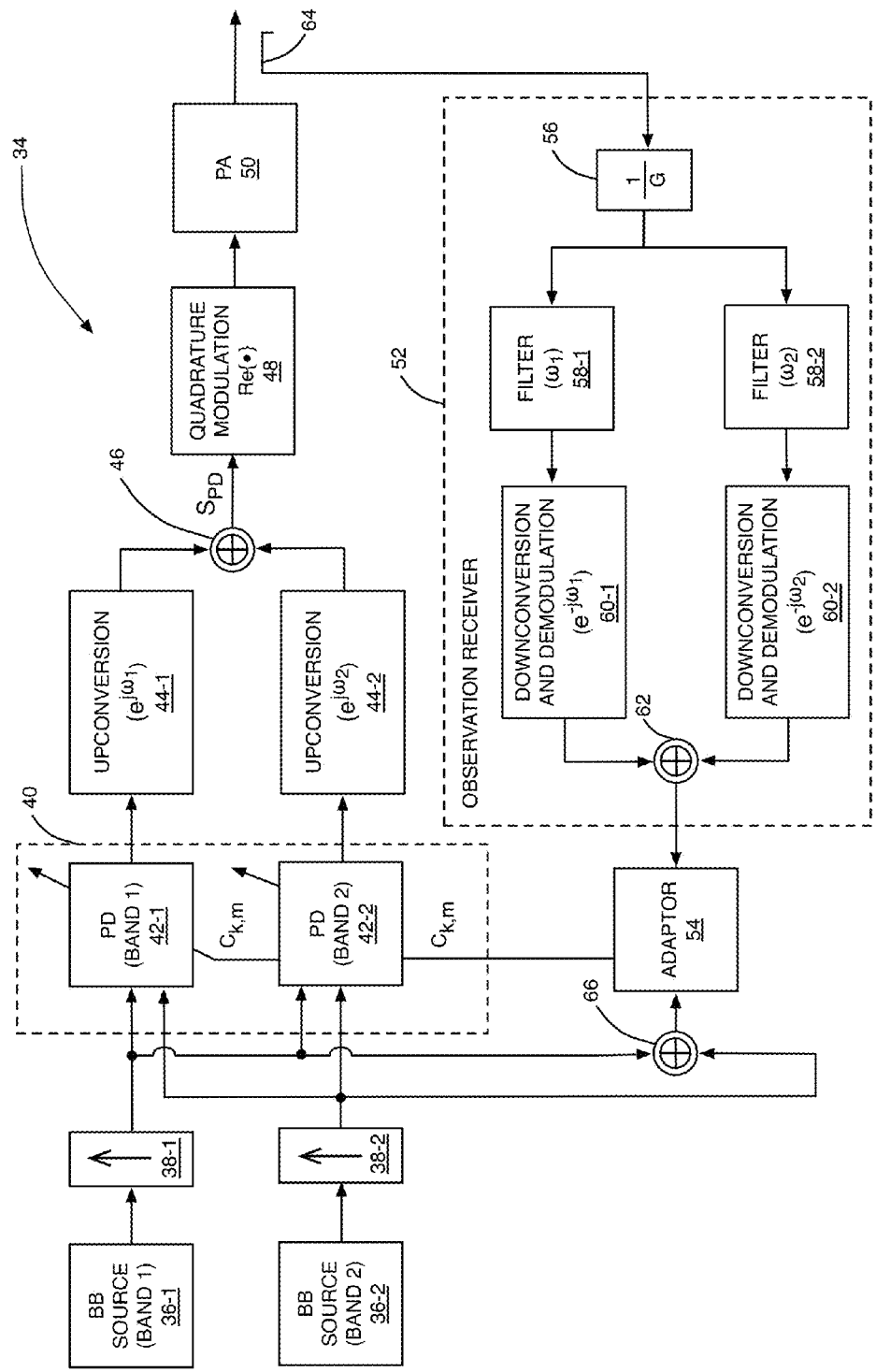
Figure 4:
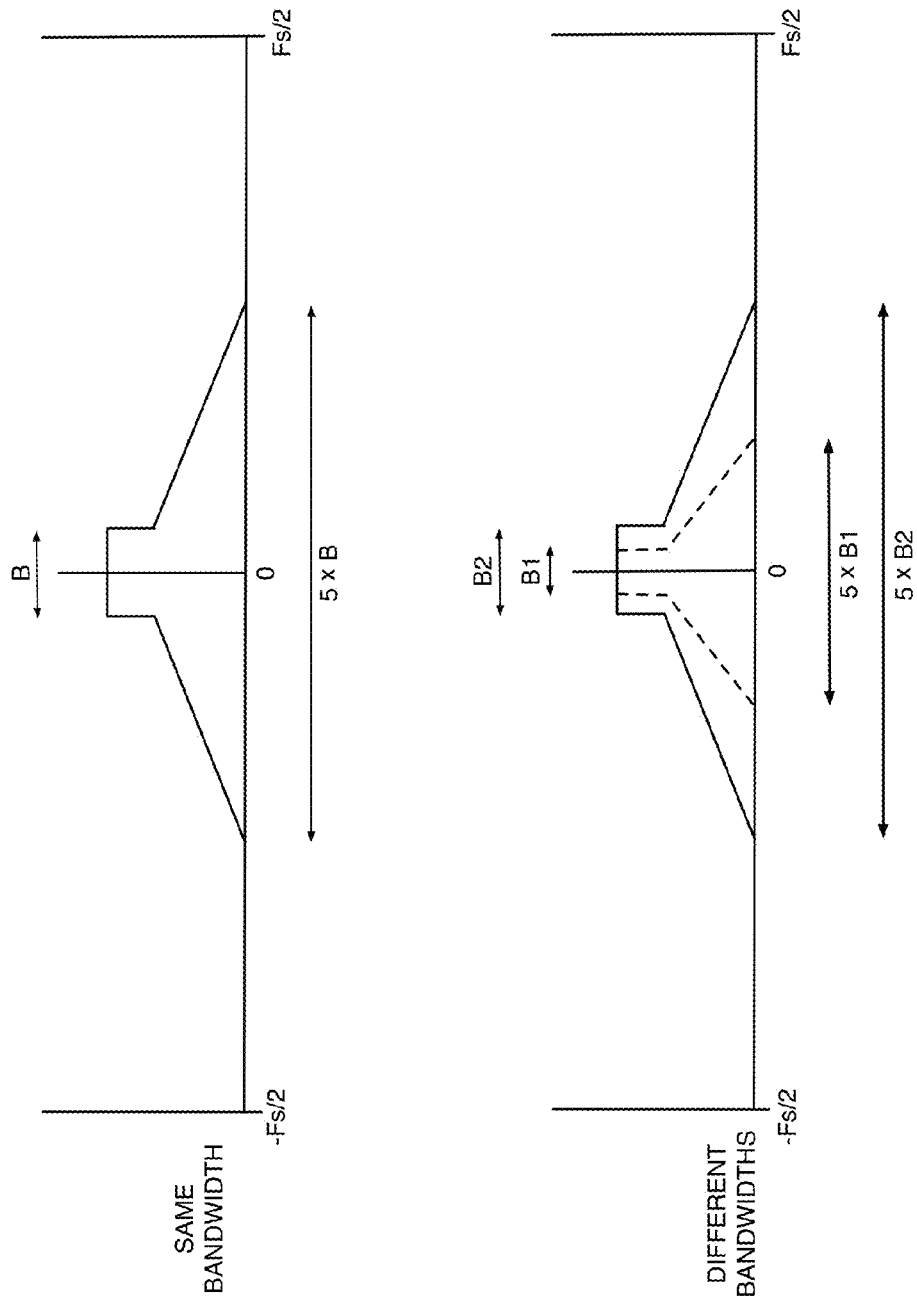
Figure 5:
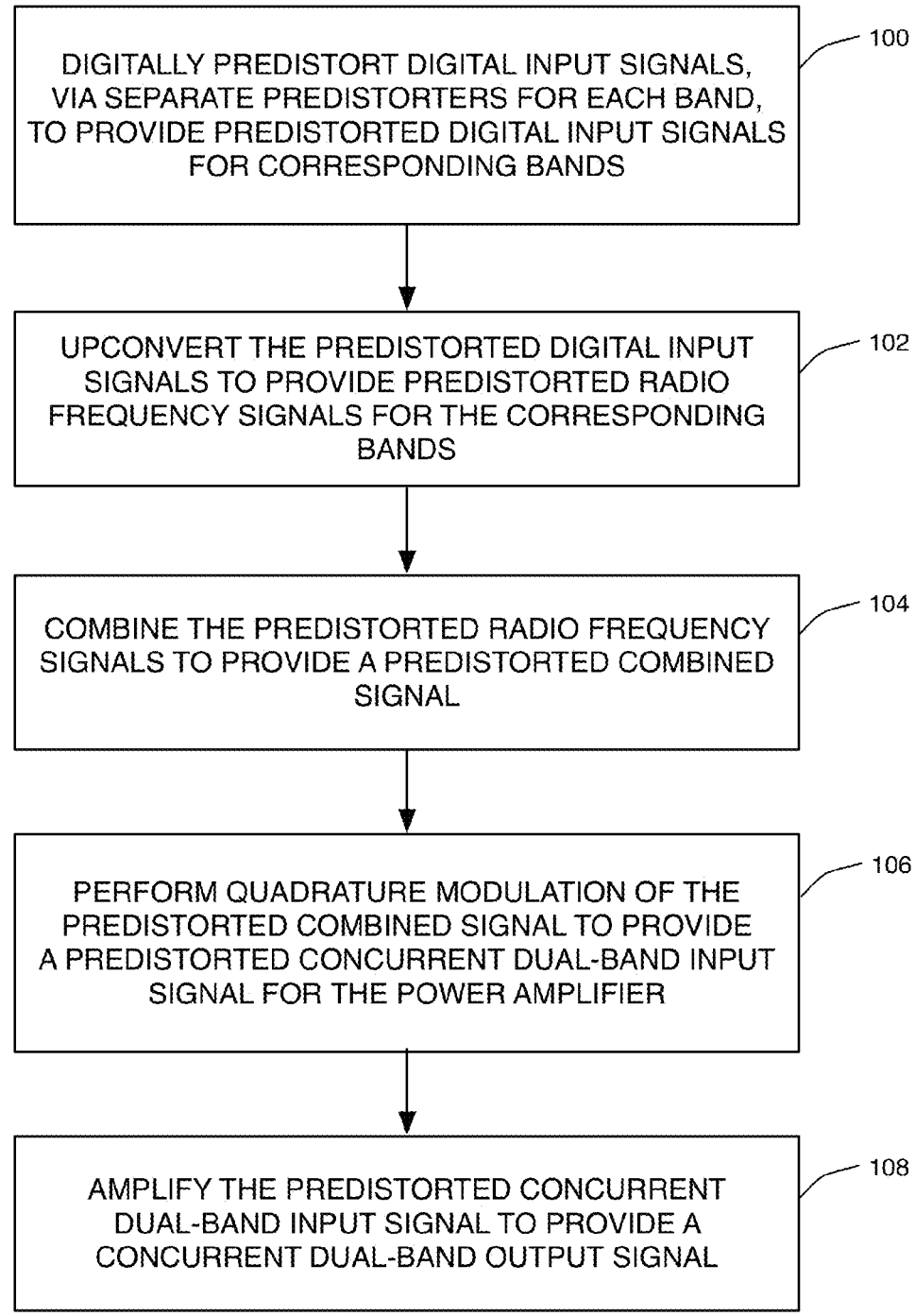
Figure 6:
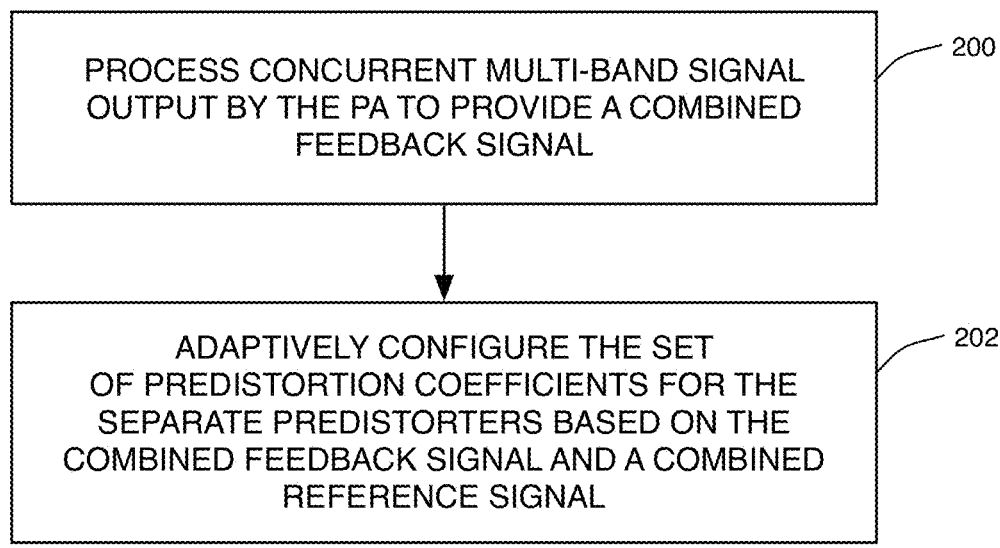
Figure 7:
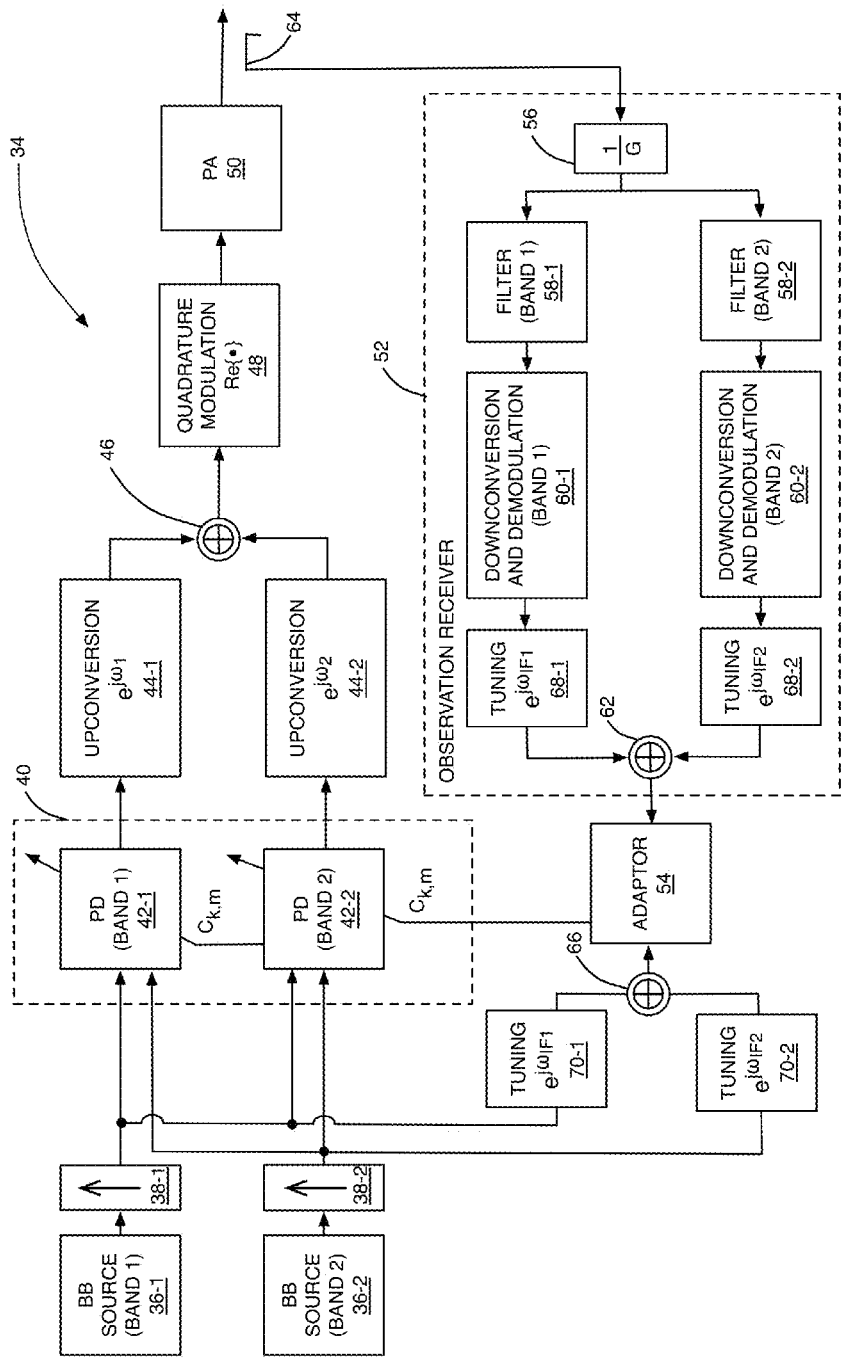
Figure 8:
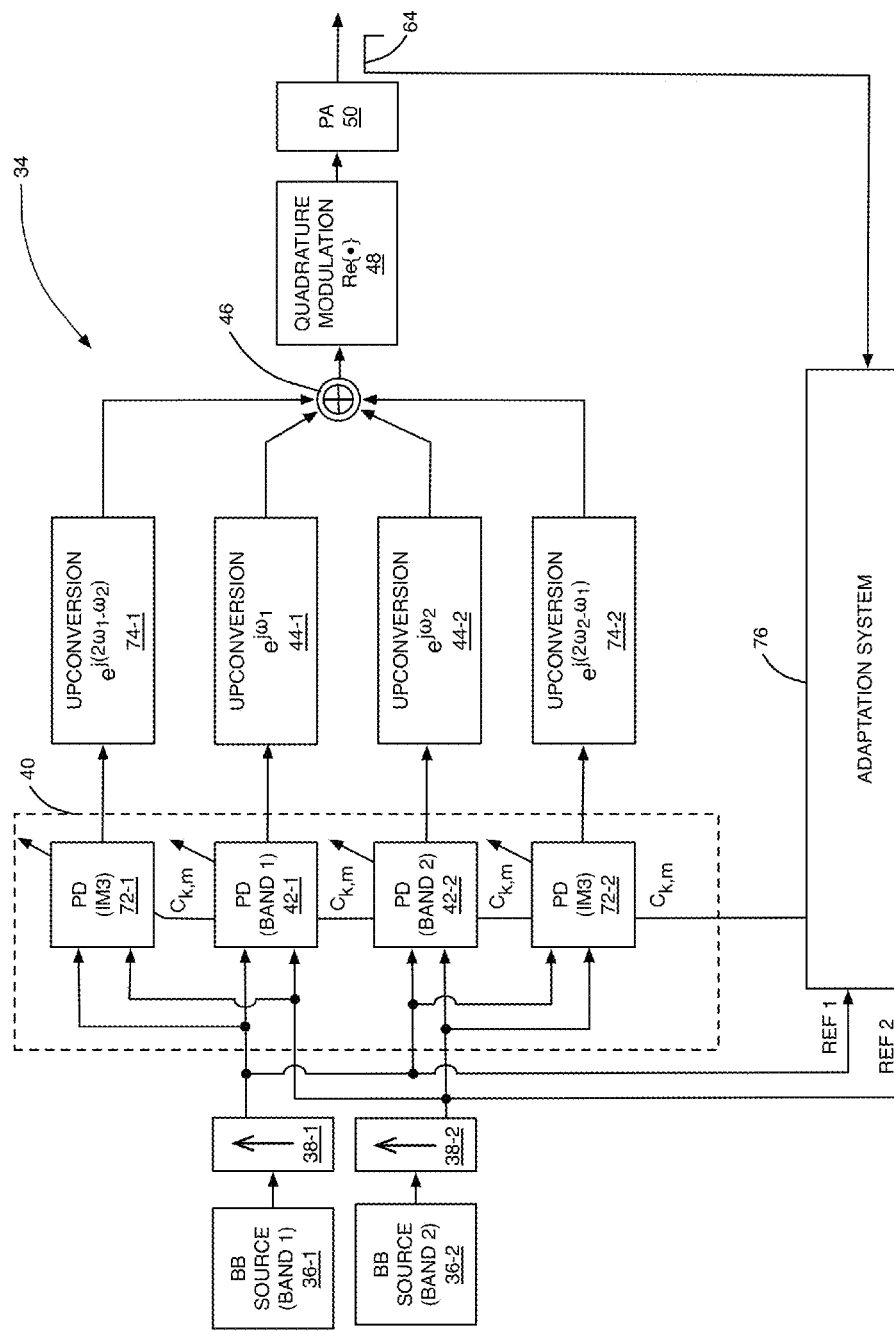
Figure 9:
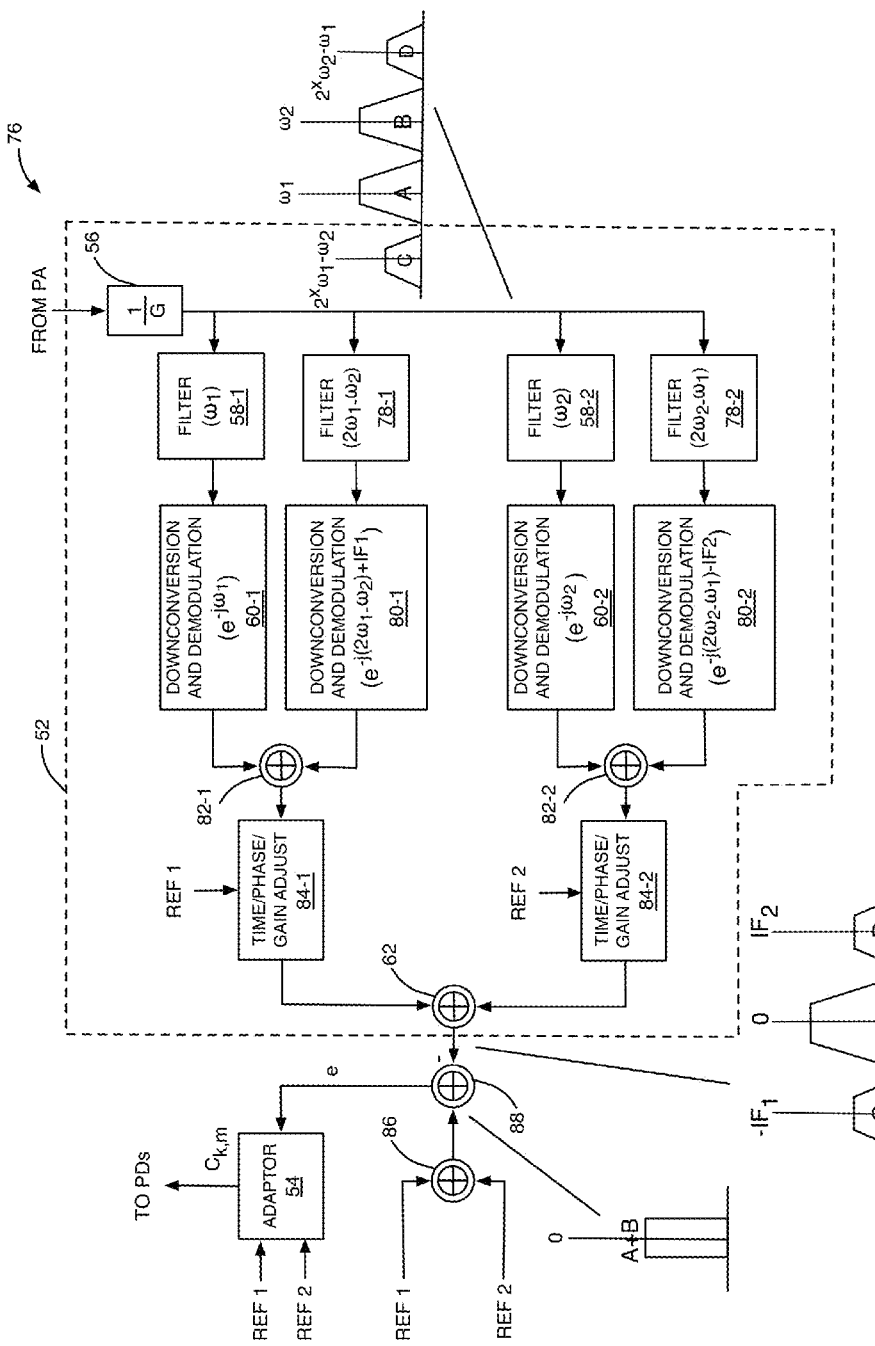
Figure 10:
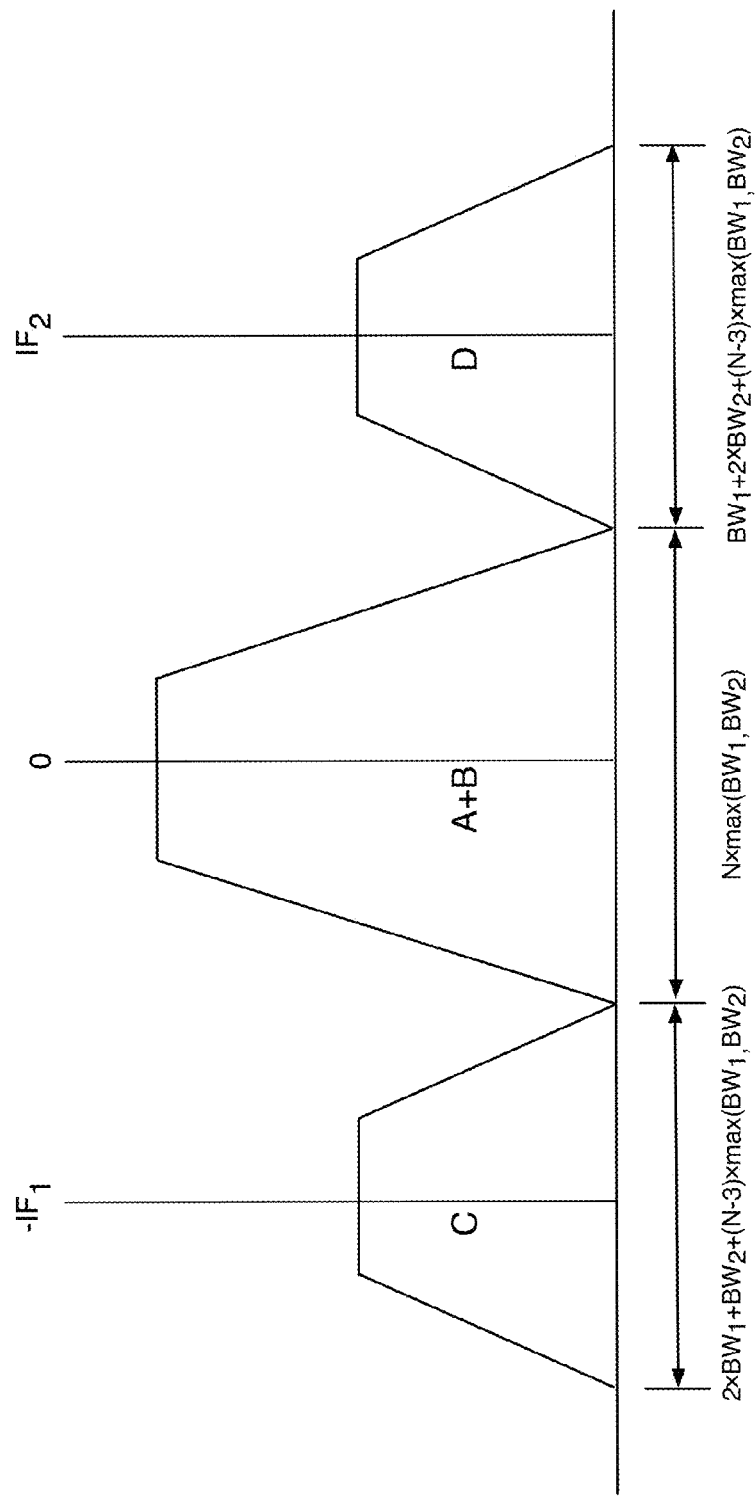

FIG. 3 illustrates a concurrent dual-band transmitter having separate digital predistorters for each band along with a single adaptor that adaptively configures each of the digital predistorters using a same set of predistortion coefficients based on a dual-band memory polynomial baseband model of the digital predistorters that utilizes the same set of predistortion coefficients for each of the digital predistorters according to one embodiment of the present disclosure;

FIG. 4 is a frequency band diagram of a combined observation signal utilized by the adaptor of FIG. 3 according to one embodiment of the present disclosure;

FIG. 5 is a flow chart that illustrates the operation of the transmit-chain of the dual-band transmitter of FIG. 3 according to one embodiment of the present disclosure;

FIG. 6 is a flow chart that illustrates the operation of the observation receiver and the adaptor of FIG. 5 according to one embodiment of the present disclosure;

FIG. 7 illustrates the concurrent dual-band transmitter according to another embodiment of the present disclosure;

FIGS. 8 and 9 illustrate the concurrent dual-band transmitter that also compensates for Third-Order Intermodulation (IM3) according to one embodiment of the present disclosure; and FIG. 10 is a frequency band diagram that illustrates the frequency bands of the combined feedback signal utilized by the adaptor of FIG. 9 according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
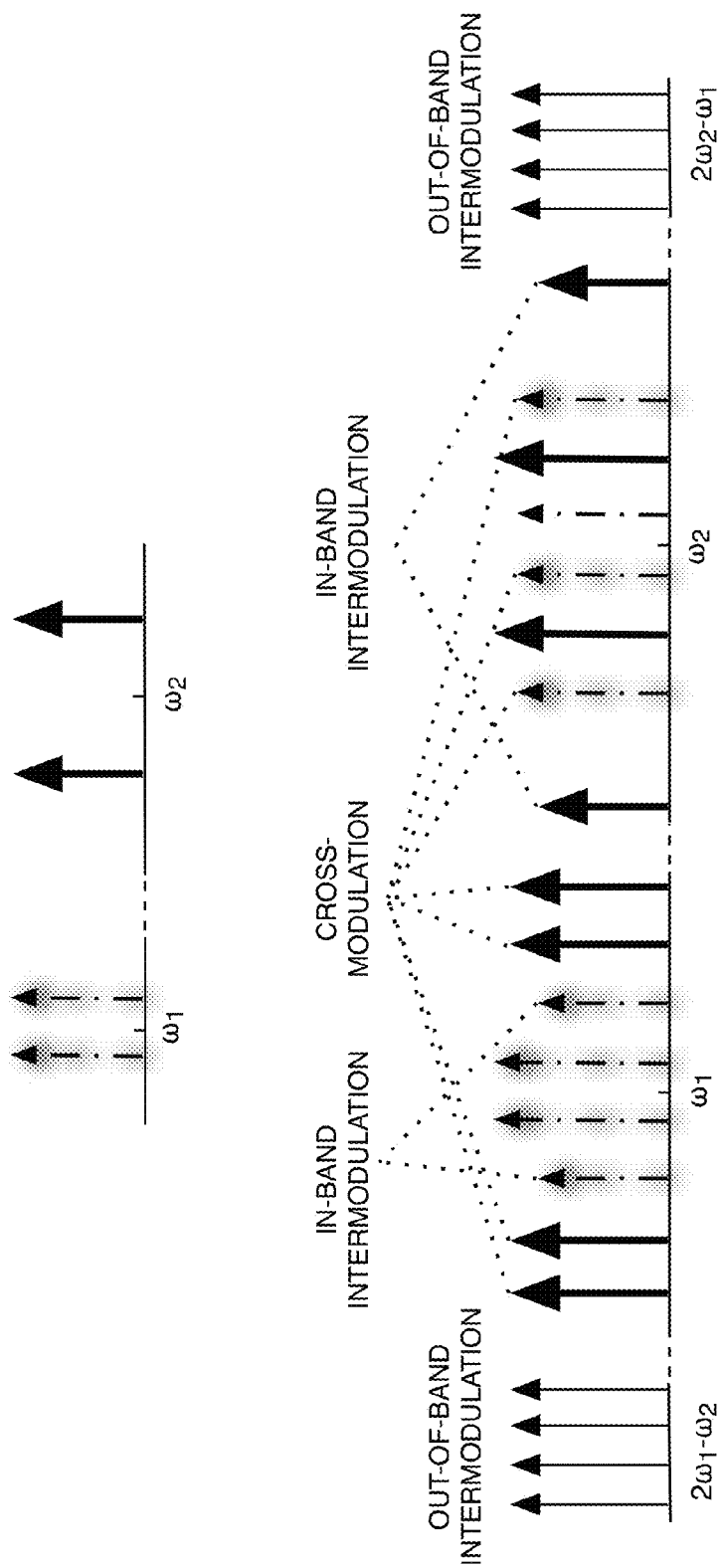
FIG. 1 illustrates intermodulation and cross modulation products in a concurrent dual-band transmitter.
Figure 2:
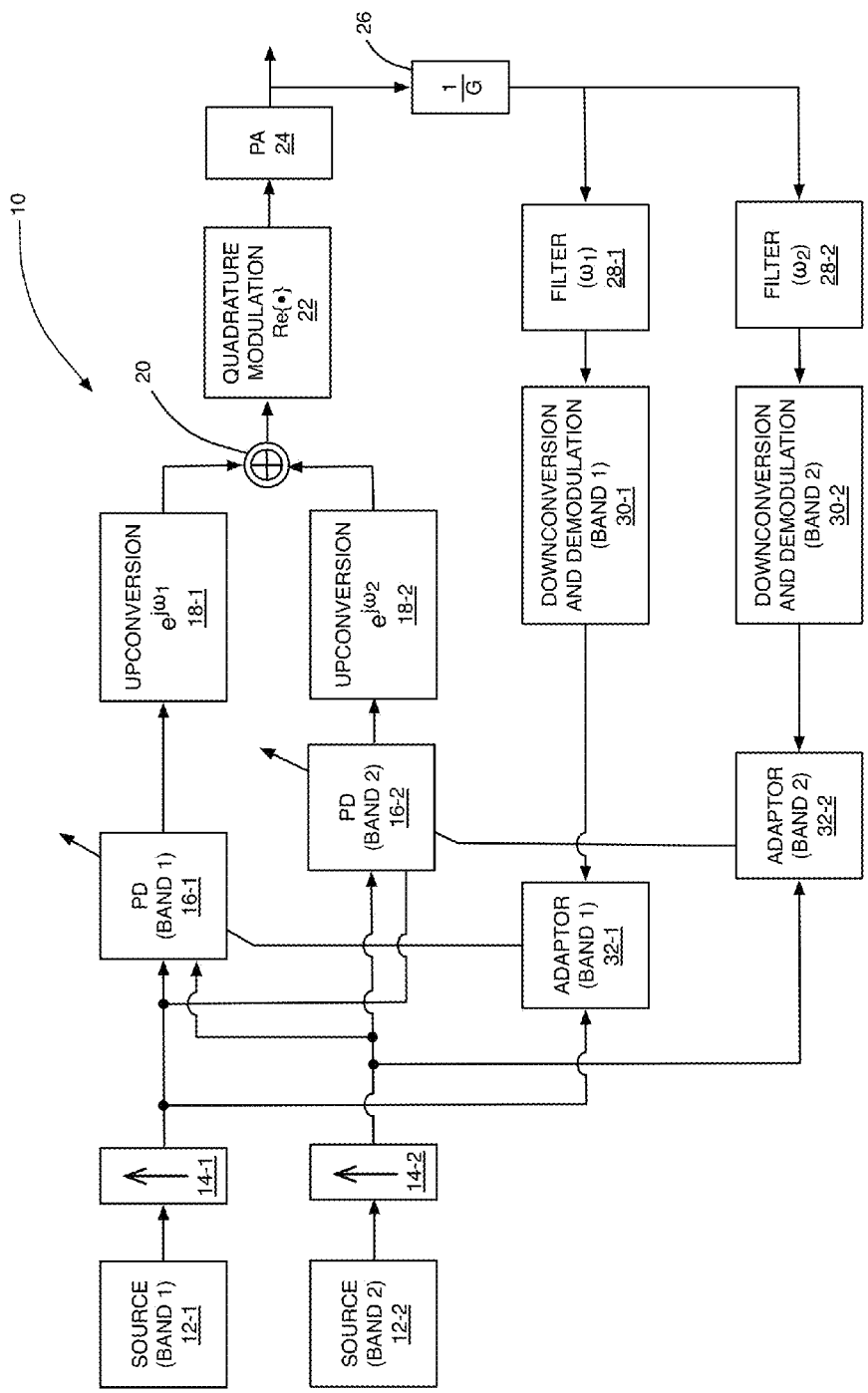
FIG. 2 illustrates a concurrent dual-band transmitter that performs dual-band digital predistortion using a conventional 2-D Digital Predistortion (2D-DPD) baseband model.

The present disclosure relates to digital predistortion for a concurrent multi-band transmitter that utilizes a single adaptor and a same set of predistortion coefficients to configure separate digital predistorters for each band. Before discussing embodiments of the present disclosure, a discussion of a concurrent dual-band transmitter 10 that utilizes a conventional dual-band predistortion baseband model as illustrated in FIG. 2 is beneficial. The concurrent dual-band transmitter 10 includes baseband sources 12-1 and 12-2 (e.g., modem(s)) of digital input signals for the concurrent dual-band transmitter 10, up-sampling circuitry 14-1 and 14-2, digital predistorters (PDs) 16-1 and 16-2, upconversion circuitry 18-1 and 18-2, combining circuitry 20, quadrature modulation circuitry 22, and power amplifier (PA) circuitry 24 connected as shown.

The baseband source 12-1 provides a digital baseband input signal for a first frequency band of a concurrent dual-band signal to be transmitted by the concurrent dual-band transmitter 10, and the baseband source 12-2 provides a digital baseband input signal for a second frequency band of the concurrent dual-band signal to be transmitted by the concurrent dual-band transmitter 10. The up-sampling circuitries 14-1 and 14-2 up-sample the digital baseband input signals to a desired sampling rate. The digital predistorter 16-1 processes the up-sampled digital baseband input signals to provide a first predistorted input signal for the first frequency band of the concurrent multi-band signal, and the digital predistorter 16-2 processes the up-sampled digital baseband input signals to provide a second predistorted input signal for the second frequency band of the concurrent multi-band signal.

The digital predistorters 16-1 and 16-2 provide the predistorted digital baseband input signals according to a conventional baseband model, i.e., either the Dual-Band Digital Predistortion (2D-DPD) baseband model of Equations (1) and (2) or the conventional 2D-Modified Memory Polynomial (2D-MMP) baseband model of Equations (3) and (4). According to the conventional baseband model, the digital predistorter 16-1 is configured by a first set of complex valued predistortion coefficients, i.e., $c_{k,j,m}^{(1)}$ of Equation (1) or $c_{k,m}^{(1)}$ of Equation (3), and the digital predistorter 16-2 is configured by a second set of complex valued predistortion coefficients, i.e., $c_{k,j,m}^{(2)}$ of Equation (2) or $c_{k,m}^{(2)}$ of Equation (4).

The upconversion circuitry 18-1 up-converts the predistorted digital baseband input signal output by the digital predistorter 16-1 to a desired carrier frequency $\omega_1$ for the first frequency band of the concurrent dual-band signal. Likewise, the upconversion circuitry 18-2 up-converts the predistorted digital baseband input signal output by the digital predistorter 16-2 to a desired carrier frequency $\omega_2$ for the second frequency band of the concurrent dual-band signal. The up-converted signals are then combined by the combining circuitry 20 and modulated by the quadrature modulation circuitry 22 to provide a predistorted concurrent dual-band input signal for the power amplifier circuitry 24. The power amplifier circuitry 24 amplifies the concurrent dual-band input signal to provide the concurrent dual-band signal to be transmitted by the concurrent dual-band transmitter 10. While not illustrated, the concurrent dual-band signal is typically filtered to remove out-of-band intermodulation distortion prior to transmission.

In order to provide adaptive configuration of the digital predistorters 16-1 and 16-2, the concurrent dual-band transmitter 10 includes a feedback path that includes an attenuator 26, filters 28-1 and 28-2, downconversion and demodulation circuitry 30-1 and 30-2, and adaptors 32-1 and 32-2. The attenuator 26 has an input that is coupled to the output of the power amplifier circuitry 24 and is configured to attenuate the concurrent dual-band signal output by the power amplifier circuitry 24 by a factor G, where G corresponds to a gain of the power amplifier circuitry 24. The filters 28-1 and 28-2 have pass-bands centered at the carrier frequencies $\omega_1$ and $\omega_2$, respectively. In operation, the filter 28-1 filters the attenuated concurrent dual-band signal to provide a feedback signal for the first frequency band of the concurrent dual-band signal. Likewise, the filter 28-2 filters the attenuated concurrent dual-band signal to provide a feedback signal for the second frequency band of the concurrent dual-band signal. The downconversion and demodulation circuitry 30-1 downconverts, demodulates, and digitizes the feedback signal for the first frequency band to provide a digital baseband feedback signal for the first frequency band. Likewise, the downconversion and demodulation circuitry 30-2 downconverts, demodulates, and digitizes the feedback signal for the second frequency band to provide a digital baseband feedback signal for the second frequency band.

Using a suitable adaptation technique (e.g., a Least Mean Squares (LMS) algorithm), the adaptor 32-1 adaptively configures the first set of predistortion coefficients for the digital predistorter 16-1 as defined by either Equation (1) of the conventional 2D-DPD model or Equation (3) of the conventional 2D-MMP model based on the up-sampled digital baseband input signal for the first frequency band and the digital baseband feedback signal for the first frequency band. In a similar manner, the adaptor 32-2 adaptively configures the second set of predistortion coefficients for the digital predistorter 16-2 as defined by either Equation (2) of the conventional 2D-DPD model or Equation (4) of the conventional 2D-MMP model based on the up-sampled digital baseband input signal for the second frequency band and the digital baseband feedback signal for the second frequency band.

As discussed above, the conventional 2D-DPD model requires a large number of predistortion coefficients, which in turn causes high complexity and cost for the digital predistorters 16-1 and 16-2 and the adaptors 32-1 and 32-2. The conventional 2D-MMP model reduces the number of predistortion coefficients. However, further reduction in the number of predistortion coefficients and thus the complexity and cost of the system is desired.

In this regard, a new baseband model for separate digital predistorters of a concurrent multi-band transmitter that utilizes a same set of predistortion coefficients for each of the digital predistorters is disclosed. Specifically, for the concurrent dual-band transmitter scenario, the following nonlinear function for fifth-order distortions is assumed:

$$y(n) = c_1(n)\Re\{x(n)\} + c_3(n)\Re\{x(n)\}^3 + c_5(n)\Re\{x(n)\}^5 \quad (5)$$

where y(n) is the distorted concurrent dual-band signal, x(n) is the concurrent dual-band input signal represented by:

$$x(n) = x_1(n) \times e^{j\omega_1 nT} + x_2(n) \times e^{j\omega_2 nT} \quad (6)$$

where $x_1(n)$ and $x_2(n)$ represent the first and second frequency bands located around carrier frequencies $\omega_1$ and $\omega_2$, respectively, and $c_1$, $c_3$, and $c_5$ are coefficients. $\Re\{arg\}$ is the real part of the argument and is defined as:

$$\Re\{arg\} = \frac{(arg + arg^*)}{2} \quad (7)$$

where (arg)* is the complex conjugate operator.

By substituting Equation (6) into Equation (5) and by expanding the terms according to Equation (7), one can derive the following equation for the terms located around the carrier frequencies $\omega_1$ and $\omega_2$:

$$y(n) = c_1(x_1(n)e^{j\omega_1 nT} + x_2(n)e^{j\omega_2 nT}) + \\ c_3 \begin{pmatrix} (x_1(n)|x_1(n)|^2 + 2x_1(n)|x_2(n)|^2)e^{j\omega_1 nT} + \\ (x_2(n)|x_2(n)|^2 + 2x_2(n)|x_1(n)|^2)e^{j\omega_2 nT} \end{pmatrix} + \\ c_5 \begin{pmatrix} (x_1(n)|x_1(n)|^4 + 6x_1(n)|x_1(n)|^2|x_2(n)|^2 + 3x_1(n)|x_2(n)|^4)e^{j\omega_1 nT} + \\ (x_2(n)|x_2(n)|^4 + 6x_2(n)|x_2(n)|^2|x_1(n)|^2 + 3x_2(n)|x_1(n)|^4)e^{j\omega_2 nT} \end{pmatrix} \quad (8)$$

Equation (8) can be re-written as two equations, one for each frequency band, as follows:

$$y_1(n) = \begin{pmatrix} c_1 x_1(n) + c_3 x_1(n)|x_1(n)|^2 + 2c_3 x_1(n)|x_2(n)|^2 + \\ c_5 x_1(n)|x_1(n)|^4 + 6c_5 x_1(n)|x_1(n)|^2|x_2(n)|^2 + \\ 3c_5 x_1(n)|x_2(n)|^4 \end{pmatrix} \times e^{j\omega_1 nT} \quad (9)$$

$$y_2(n) = \begin{pmatrix} c_1 x_2(n) + c_3 x_2(n)|x_2(n)|^2 + 2c_3 x_2(n)|x_1(n)|^2 + \\ c_5 x_2(n)|x_2(n)|^4 + 6c_5 x_2(n)|x_2(n)|^2|x_1(n)|^2 + \\ 3c_5 x_2(n)|x_1(n)|^4 \end{pmatrix} \times e^{j\omega_2 nT} \quad (10)$$

From Equations (8)-(10), the inventors have found that the two frequency bands share the same set of coefficients and that, in this example, only three coefficients ($c_1$, $c_2$, and $c_3$) need to be calculated. The benefit of doing so is that a reduced number of predistortion coefficients are needed in the baseband model, which greatly simplifies the complexity of the digital predistortion system and that of the concurrent dual-band transmitter.

Based on this knowledge that the same set of coefficients can be used for each of the frequency bands, the inventors have developed a new digital baseband model that is based on a memory polynomial model and where the new baseband model uses the same set of predistortion coefficients for each of the frequency bands. Specifically, the new baseband model is defined as:

$$y_1(n) = \sum_{m=0}^{M-1} \sum_{k=0}^{N-1} c_{k,m} x_1(n-m) \left| a_{k+1} |x_1(n-m)| + j b_{k+1} |x_2(n-m)| \right|^k \quad (11)$$

$$y_2(n) = \sum_{m=0}^{M-1} \sum_{k=0}^{N-1} c_{k,m} x_2(n-m) \left| a_{k+1} |x_2(n-m)| + j b_{k+1} |x_1(n-m)| \right|^k \quad (12)$$

where $y_i(n)$ is a predistorted output signal of a digital predistorter for band i (i=1, 2 for a concurrent dual-band transmitter), M represents a memory depth of the new baseband model, N is the nonlinear order of the new baseband model (i.e., an order of nonlinearity compensated for by the digital predistorters), $c_{k,m}$ are complex valued predistortion coefficients for the digital predistorter for each of the frequency bands, $x_1$ is the digital input signal for the first band, $x_2$ is the digital input signal for the second band, and where $a_{k+1}$ and $b_{k+1}$ are pre-calculated (k+1)-th order envelope coupling factors between $x_1$ and $x_2$. Importantly, the set of predistortion coefficients $c_{k,m}$ is the same for each of the frequency bands. In other words, the same set of predistortion coefficients $c_{k,m}$ is used to configure each of the digital predistorters. Thus, the number of predistortion coefficients required by the new baseband model of Equations (11) and (12) is half the number of predistortion coefficients required by the conventional 2D-MMP baseband model of Equations (3) and (4).

The envelope coupling factors $a_{k+1}$ and $b_{k+1}$ are pre-calculated (i.e., are not adaptively configured) using the following algorithm. Using the dual-band scenario with $7^{th}$ order non-linearity and no memory terms as an example, the output of the power amplifier (or likewise the combined output of the digital predistorters) can be defined as:

$$y(n) = c_1(n)\Re\{x(n)\} + c_3(n)\Re\{x(n)\}^3 + \\ c_5(n)\Re\{x(n)\}^5 + c_7(n)\Re\{x(n)\}^7 \quad (13)$$

If only the terms that are located at the two carrier frequencies $\omega_1$ and $\omega_2$ are considered and taking out all common scalars (which are 3, 10, and 35 for $c_3$, $c_5$, and $c_7$, respectively), Equation (13) can be re-written for the two frequency bands as:

$$y_1(n) = c_1 x_1(n) + c_3 x_1(n)|x_1(n)|^2 + 2c_3 x_1(n)|x_2(n)|^2 + \quad (14)$$
$$c_5 x_1(n)|x_1(n)|^4 + 6c_5 x_1(n)|x_1(n)|^2|x_2(n)|^2 + 3c_5 x_1(n)|x_2(n)|^4 +$$
$$c_7 x_1(n)|x_1(n)|^6 + 18c_7 x_1(n)|x_1(n)|^2|x_2(n)|^4 +$$
$$12c_7 x_1(n)|x_1(n)|^4|x_2(n)|^2 + 4c_7 x_1(n)|x_2(n)|^6$$

$$y_2(n) = c_1 x_2(n) + c_3 x_2(n)|x_2(n)|^2 + 2c_3 x_2(n)|x_1(n)|^2 + \quad (15)$$
$$c_5 x_2(n)|x_2(n)|^4 + 6c_5 x_2(n)|x_1(n)|^2|x_2(n)|^2 + 3c_5 x_2(n)|x_1(n)|^4 +$$
$$c_7 x_2(n)|x_2(n)|^6 + 18c_7 x_2(n)|x_2(n)|^2|x_1(n)|^4 +$$
$$12c_7 x_2(n)|x_2(n)|^4|x_1(n)|^2 + 4c_7 x_2(n)|x_1(n)|^6$$

From the 2D-DPD baseband model of Equations (1) and (2), if M=1 and N=7, then Equations (1) and (2) become:

$$y_1(n) = c^{(1)}_{0,0,0} x_1(n) + c^{(1)}_{2,0,0} x_1(n)|x_1(n)|^2 + \quad (16)$$
$$c^{(1)}_{2,2,0} x_1(n)|x_2(n)|^2 + c^{(1)}_{4,0,0} x_1(n)|x_1(n)|^4 +$$
$$c^{(1)}_{4,2,0} x_1(n)|x_1(n)|^2|x_2(n)|^2 + c^{(1)}_{4,4,0} x_1(n)|x_2(n)|^4 +$$
$$c^{(1)}_{6,0,0} x_1(n)|x_1(n)|^6 + c^{(1)}_{6,2,0} x_1(n)|x_1(n)|^4|x_2(n)|^2 +$$
$$c^{(1)}_{6,4,0} x_1(n)|x_1(n)|^2|x_2(n)|^4 + c^{(1)}_{6,6,0} x_1(n)|x_2(n)|^6$$

$$y_2(n) = c^{(2)}_{0,0,0} x_2(n) + c^{(2)}_{2,0,0} x_2(n)|x_2(n)|^2 + \quad (17)$$
$$c^{(2)}_{2,2,0} x_2(n)|x_1(n)|^2 + c^{(2)}_{4,0,0} x_2(n)|x_2(n)|^4 +$$
$$c^{(2)}_{4,2,0} x_2(n)|x_2(n)|^2|x_1(n)|^2 + c^{(2)}_{4,4,0} x_2(n)|x_1(n)|^4 +$$
$$c^{(2)}_{6,0,0} x_2(n)|x_2(n)|^6 + c^{(2)}_{6,2,0} x_2(n)|x_2(n)|^4|x_1(n)|^2 +$$
$$c^{(2)}_{6,4,0} x_2(n)|x_2(n)|^2|x_1(n)|^4 + c^{(2)}_{6,6,0} x_2(n)|x_1(n)|^6$$

Comparing Equations (16) and (17) to Equations (14) and (15), it can be seen that the number of parameters (i.e., predistortion coefficients) is half. It can also be observed that the basis functions for $y_1(n)$ are $|x_1(n)|^2$, $2|x_2(n)|^2$, $|x_1(n)|^4$, $6|x_2|x_2(n)|^2$, $3|x_2(n)|^4$, $|x_1(n)|^6$, $18|x_1(n)|^2|x_2(n)|^4$, $12|x_1(n)|^4|x_2(n)|^2$, and $4|x_2(n)|^6$. Similarly, the basis functions for $y_2(n)$ are $|x_2(n)|^2$, $2|x_1(n)|^2$, $|x_2(n)|^4$, $6|x_1(n)|^2|x_2(n)|^2$, $3x_1(n)|^4$, $|x_2(n)|^6$, $18|x_2(n)|^2|x_1(n)|^4$, $12|x_2(n)|^4|x_1(n)|^2$, and $4|x_1(n)|^6$. From this observation, one is reminded of an envelope calculation in the complex domain.

Now, if the new baseband model of Equations (11) and (12) is considered, for M=1 and N=7, the new baseband model can be re-written as:

$$y_1(n) = c_{0,0} x_1(n) + a_2^2 \cdot c_{2,0} x_1(n)|x_1(n)|^2 + \quad (18)$$
$$b_2^2 \cdot c_{2,0} x_1(n)|x_2(n)|^2 + a_4^4 \cdot c_{4,0} x_1(n)|x_1(n)|^4 +$$
$$2a_4^2 b_4^2 \cdot c_{4,0} x_1(n)|x_1(n)|^2|x_2(n)|^2 + b_4^4 \cdot c_{4,0} x_1(n)|x_2(n)|^4 +$$
$$a_6^6 \cdot c_{6,0} x_1(n)|x_1(n)|^6 + 3a_6^4 b_6^2 \cdot c_{6,0} x_1(n)|x_1(n)|^4|x_2(n)|^2 +$$
$$3a_6^2 b_6^4 \cdot c_{6,0} x_1(n)|x_1(n)|^2|x_2(n)|^4 + b_6^6 \cdot c_{6,0} x_1(n)|x_2(n)|^6$$

$$y_2(n) = c_{0,0} x_2(n) + a_2^2 \cdot c_{2,0} x_2(n)|x_2(n)|^2 + \quad (19)$$
$$b_2^2 \cdot c_{2,0} x_2(n)|x_1(n)|^2 + a_4^4 \cdot c_{4,0} x_2(n)|x_2(n)|^4 +$$
$$2a_4^2 b_4^2 \cdot c_{4,0} x_2(n)|x_2(n)|^2|x_1(n)|^2 + b_4^4 \cdot c_{4,0} x_2(n)|x_1(n)|^4 +$$
$$a_6^6 \cdot c_{6,0} x_2(n)|x_2(n)|^6 + 3a_6^4 b_6^2 \cdot c_{6,0} x_2(n)|x_2(n)|^4|x_1(n)|^2 +$$
$$3a_6^2 b_6^4 \cdot c_{6,0} x_2(n)|x_2(n)|^2|x_1(n)|^4 + b_6^6 \cdot c_{6,0} x_2(n)|x_1(n)|^6$$

where the coefficients a and b are real numbers.

By comparing Equations (18) and (19) with Equations (14) and (15), the following relationships can be defined as illustrated below in Table 1.

TABLE 1

| | | | |
|---|---|---|---|
| $a_2^2 \cdot c_{2,0} = c_3$ | $b_2^2 \cdot c_{2,0} = 2c_3$ | — | — |
| $a_4^4 \cdot c_{4,0} = c_5$ | $2a_4^2 b_4^2 \cdot c_{4,0} = 6c_5$ | $b_4^4 \cdot c_{4,0} = 3c_5$ | — |
| $a_6^6 \cdot c_{6,0} = c_7$ | $3a_6^4 b_6^2 \cdot c_{6,0} = 12c_7$ | $3a_6^2 b_6^4 \cdot c_{6,0} = 18c_7$ | $b_6^6 \cdot c_{6,0} = 4c_7$ |

From Table 1, it can be derived that the coefficients $a_2$, $a_4$, and $a_6$ can be set to 1, while $b_2$ can be set to $\sqrt{2}$, $b_4$ can be set to $\sqrt{3}$ or $\sqrt[4]{3}$, and $b_6$ can be set to 2, $\sqrt[4]{6}$, or $\sqrt[3]{2}$. Note that since $b_4$ and $b_6$ can be multiple different values, the actual values used in implementation may be the optimal values for that particular implementation. The process described above for determining the values for the envelope coupling factors $a_{k+1}$ and $b_{k+1}$ can be extended to any desired memory-order and any desired order of nonlinearity.

FIG. 3 illustrates a concurrent dual-band transmitter 34 that utilizes the new baseband model described above according to one embodiment of the present disclosure. As illustrated, the concurrent dual-band transmitter 34 includes baseband (BB) sources 36-1 and 36-2 (e.g., modem(s)), up-sampling circuitry 38-1 and 38-2, a digital predistortion subsystem 40 that includes digital predistorters (PDs) 42-1 and 42-2, upconversion circuitry 44-1 and 44-2, combining circuitry 46, quadrature modulation circuitry 48, and power amplifier circuitry 50 connected as shown.

The baseband source 36-1 provides a digital input signal, which in this embodiment is a baseband signal, for a first frequency band of a concurrent dual-band signal to be transmitted by the concurrent dual-band transmitter 34. Likewise, the baseband source 36-2 provides a digital input signal, which in this embodiment is a baseband signal, for a second frequency band of the concurrent dual-band signal to be transmitted by the concurrent dual-band transmitter 34. The up-sampling circuitries 38-1 and 38-2 up-sample the digital input signals to a desired sampling rate. The digital predistorter 42-1 processes the up-sampled digital input signals to provide a first predistorted input signal for the first frequency band of the concurrent multi-band signal, and the digital predistorter 42-2 processes the up-sampled digital input signals to provide a second predistorted input signal for the second frequency band of the concurrent multi-band signal. The digital predistorters 42-1 and 42-2 provide the predistorted digital baseband input signals according to the new baseband model of Equations (11) and (12). Importantly, according to the new baseband model, the both the digital predistorter 42-1 and the digital predistorter 42-2 are configured by the same set of predistortion coefficients $c_{k,m}$.

The upconversion circuitry 44-1 up-converts the predistorted digital baseband input signal output by the digital predistorter 42-1 to a desired carrier frequency $\omega_1$ for the first frequency band of the concurrent dual-band signal. Likewise, the upconversion circuitry 44-2 up-converts the predistorted digital baseband input signal output by the digital predistorter 42-2 to a desired carrier frequency $\omega_2$ for the second frequency band of the concurrent dual-band signal. The up-converted signals are then combined by the combining circuitry 46 and modulated by the quadrature modulation circuitry 48 to provide a predistorted concurrent dual-band input signal for the power amplifier circuitry 50. It should be noted that digital-to-analog conversion can occur before upconversion for an analog upconversion implementation. Alternatively, digital-to-analog conversion may occur after upconversion for a digital upconversion implementation.

While not essential for understanding the concepts disclosed herein, for more information regarding digital upconversion, the interested reader is directed to U.S. Patent Application Publication No. 2010/0098191 A1, entitled METHODS AND SYSTEMS FOR PROGRAMMABLE DIGITAL UP-CONVERSION, filed on Oct. 20, 2008, and published on Apr. 22, 2010 and U.S. patent application Ser. No. 13/490,801, entitled PROGRAMMABLE DIGITAL UP-CONVERSION FOR CONCURRENT MULTI-BAND SIGNALS, filed on Jun. 7, 2012, both of which are hereby incorporated herein by reference for their teachings related to digital upconversion. The power amplifier circuitry 50 amplifies the concurrent dual-band input signal to provide the concurrent dual-band signal to be transmitted by the concurrent dual-band transmitter 34. While not illustrated, subsequent to amplification, the concurrent dual-band signal is preferably filtered to remove out-of-band intermodulation distortion prior to transmission.

In order to provide adaptive configuration of the digital predistorters 42-1 and 42-2 via the same set of predistortion coefficients $c_{k,m}$, the concurrent dual-band transmitter 34 includes a feedback path that includes an observation receiver 52 and a single adaptor 54 (hereinafter "adaptor 54"). The observation receiver 52 includes an attenuator 56, filters 58-1 and 58-2, downconversion and demodulation circuitry 60-1 and 60-2, and combining circuitry 62 connected as shown. The attenuator 56 has an input that is coupled to the output of the power amplifier circuitry 50 via a coupler 64. The attenuator 56 is configured to attenuate the concurrent dual-band signal output by the power amplifier circuitry 50 by a factor G, where G corresponds to a gain of the power amplifier circuitry 50. The filters 58-1 and 58-2 have pass-bands centered at the carrier frequencies $\omega_1$ and $\omega_2$ of the concurrent dual-band signal, respectively.

In operation, the filter 58-1 filters the attenuated concurrent dual-band signal to provide a feedback signal for the first frequency band of the concurrent dual-band signal. Likewise, the filter 58-2 filters the attenuated concurrent dual-band signal to provide a feedback signal for the second frequency band of the concurrent dual-band signal. The downconversion and demodulation circuitry 60-1 downconverts, demodulates, and digitizes the feedback signal for the first frequency band to provide a digital feedback signal for the first frequency band. Likewise, the downconversion and demodulation circuitry 60-2 downconverts, demodulates, and digitizes the feedback signal for the second frequency band to provide a digital feedback signal for the second frequency band. In this embodiment, the feedback signals for the first and second frequency bands are both at baseband.

The combining circuitry 62 combines the digital feedback signals for the first and second frequency bands to provide a combined digital feedback signal. Because the digital feedback signals for both of the frequency bands are at baseband, frequency bands, or spectrums, for the digital feedback signals for the two frequency bands overlap as illustrated in FIG. 4. When compensating for up to $5^{th}$ order distortion for example, if the two digital input signals have a same bandwidth B, then the bandwidth of the combined digital feedback signal is 5×B due to bandwidth expansion resulting from the distortion or nonlinearity of the power amplifier circuitry 50. If the two digital input signals have different bandwidths $B_1$ and $B_2$, then when compensating for up to $5^{th}$ order distortion, the bandwidth of the combined digital feedback signal is the larger of $5×B_1$ and $5×B_2$. As such, by combining the digital feedback signals for the two frequency bands at baseband, the frequency bands of the two digital feedback signals overlap, which in turn substantially reduces the bandwidth of the combined feedback signal as compared to the bandwidth of the concurrent dual-band signal at the output of the power amplifier circuitry 50. As a result of the reduced bandwidth, a sampling rate requirement for the feedback path is substantially reduced, which in turn reduces the complexity and cost of the concurrent dual-band transmitter 34.

Returning to FIG. 3, the concurrent dual-band transmitter 34 also includes combining circuitry 66 that combines the two up-sampled digital input signals to provide a combined reference signal. As discussed above, in this embodiment, the up-sampled digital input signals are at baseband. As such, after combining the two up-sampled digital input signals, the frequency bands of the two up-sampled digital input signals overlap in the combined reference signal in same manner as described above with respect to the digital feedback signals in the combined feedback signal (but without bandwidth expansion).

The adaptor 54 adaptively configures the set of predistortion coefficients $c_{k,m}$ for the digital predistorters 42-1 and 42-2 in the new baseband model of Equations (11) and (12) based on the combined reference signal and the combined feedback signal. Specifically, the adaptor 54 utilizes any suitable technique (e.g., LMS) to compute or otherwise determine values for the set of predistortion coefficients $c_{k,m}$ that minimize an error between the combined reference signal and the combined feedback signal. In this manner, the single adaptor 54 configures a single set of predistortion coefficients $c_{k,m}$ that, according to the new baseband model, is used to configure each of the digital predistorters 42-1 and 42-2.

FIG. 5 is a flow chart that illustrates the operation of the transmit chain of the concurrent dual-band transmitter 34 of FIG. 3 according to one embodiment of the present disclosure. While the steps of the process of FIG. 5 are illustrated as being performed in a particular order, it should be noted that unless explicitly stated or otherwise required, the steps may be performed in any desired order. This also applies to the steps of any other processes illustrated and described herein. As illustrated in FIG. 5, the digital predistorters 42-1 and 42-2 digitally predistort the digital input signals to provide the predistorted digital input signals for each frequency band (step 100). More specifically, in the embodiment of FIG. 3, the digital predistorter 42-1 processes the up-sampled digital input signals to provide the predistorted digital input signal for the first frequency band, and the digital predistorter 42-2 processes the up-sampled digital input signals to provide the predistorted digital input signal for the second frequency band. Next, the predistorted digital input signals are up-converted by the upconversion circuitry 44-1 and 44-2 to the carrier frequencies $\omega_1$ and $\omega_2$, respectively (step 102). The predistorted up-converted, or radio frequency, signals are then combined by the combining circuitry 46 to provide a predistorted combined signal (step 104). Notably, in one alternative embodiment, the predistorted signals may be combined prior to upconversion. The predistorted combined signal is then quadrature modulated to provide the predistorted concurrent dual-band input signal for the power amplifier circuitry 50 (step 106). Lastly, the predistorted concurrent dual-band input signal is amplified by the power amplifier circuitry 50 (step 108).

FIG. 6 illustrates the operation of the feedback path of the concurrent dual-band transmitter 34 of FIG. 3 according to one embodiment of the present disclosure. As illustrated, the observation receiver 52 processes the concurrent multi-band signal (more specifically in this example, a concurrent dual-band signal) received from the output of the power amplifier circuitry 50 via the coupler 64 to provide the combined feedback signal (step 200). The adaptor 54 then adaptively configures the set of predistortion coefficients for the digital predistorters 42-1 and 42-2 based on the combined feedback signal and the combined reference signal (step 202).

FIG. 7 illustrates the concurrent dual-band transmitter 34 according to another embodiment of the present disclosure. This embodiment is substantially the same as that of FIG. 3 but where the component signals of the combined feedback signal and the component signals of the combined reference signal are tuned to intermediate frequencies in such a manner as to reduce or minimize the bandwidth of the combined feedback signal and thus the sampling rate requirement for Analog-to-Digital (A/D) conversion in the feedback path. More specifically, in this embodiment, after downconversion and demodulation, the digital feedback signal for the first frequency band is tuned to a first intermediate frequency $\omega_{IF1}$ via tuning circuitry 68-1. In a similar manner, the digital feedback signal for the second frequency band is tuned to a second intermediate frequency $\omega_{IF2}$ via tuning circuitry 68-2. As a result, in the combined feedback signal, the signal component for the first frequency band is tuned to the first intermediate frequency $\omega_{IF1}$ and the signal component for the second frequency band is tuned to the second intermediate frequency $\omega_{IF2}$.

In the same manner, the concurrent dual-band transmitter 34 includes tuning circuitry 70-1 that tunes the up-sampled digital input signal for the first frequency band to the first intermediate frequency $\omega_{IF1}$ and tuning circuitry 70-2 that tunes the up-sampled digital input signal for the second frequency band to the second intermediate frequency $\omega_{IF2}$. As a result, in the combined reference signal, the signal component for the first frequency band is tuned to the first intermediate frequency $\omega_{IF1}$ and the signal component for the second frequency band is tuned to the second intermediate frequency $\omega_{IF2}$. The adaptor 54 then adaptively configures the set of predistortion coefficients, and thus the digital predistorters 42-1 and 42-2, in such a manner as to minimize the error between the combined reference signal and the combined feedback signal.

In one embodiment, a frequency separation between the first and second intermediate frequencies $\omega_{IF1}$ and $\omega_{IF2}$ is greater than or equal to a minimum frequency separation below which the two frequency bands in the combined feedback signal begin to overlap for the maximum order of distortion to be compensated for by the digital predistorters 42-1 and 42-2. So, for the fifth order case, the frequency separation between the first and second intermediate frequencies $\omega_{IF1}$ and $\omega_{IF2}$ is greater than or equal to $$\frac{5}{2}B_1 + \frac{5}{2}B_2,$$

where $B_1$ is the bandwidth of the digital input signal for the first frequency band and $B_2$ is the bandwidth for the digital input signal for the second frequency band. Thus, in one particular embodiment, the two intermediate frequencies are selected such that:

$$IF_1 = -\frac{5(B_1 + B_2)}{2} + \frac{5}{2}B_1 = -\frac{5}{2}B_2, \text{ and} \quad (20)$$

$$IF_2 = \frac{5(B_1 + B_2)}{2} - \frac{5}{2}B_2 = \frac{5}{2}B_1. \quad (21)$$

By selecting the two intermediate frequencies in this manner, the bandwidth of the combined feedback signal is substantially reduced as compared to the bandwidth of the concurrent multi-band signal (or in other words the observed bandwidth of the observation receiver 52). As a result, the sampling rate requirement for A/D conversion in the feedback path is substantially reduced. Note that while the first and second intermediate frequencies $\omega_{IF1}$ and $\omega_{IF2}$ can be selected to avoid overlap of the frequency bands of the component signals in the combined reference signal and the combined feedback signal, the first and second intermediate frequencies $\omega_{IF1}$ and $\omega_{IF2}$ are not limited thereto. The first and second intermediate frequencies $\omega_{IF1}$ and $\omega_{IF2}$ may alternatively be selected to allow some amount of overlap between the frequency bands of the combined feedback signal or even the combined reference signal.

Thus far, the embodiments have focused on predistortion that compensates for in-band intermodulation and cross-modulation distortion. However, the new baseband model may be expanded to compensate for Third-Order Intermodulation (IM3) distortion. Using the dual-band scenario as an example, by substituting Equation (6) into Equation (5) and by expanding the terms according to Equation (7), one can derive the following equation for the terms located around the frequencies $\omega_1$, $\omega_2$, $2\omega_1-\omega_2$, and $2\omega_2-\omega_1$:

$$y(n) = c_1(x_1(n)e^{j\varpi_1 nT} + x_2(n)e^{j\varpi_2 nT}) + \quad (22)$$

$$c_3 \begin{pmatrix} (x_1(n)|x_1(n)|^2 + 2x_1(n)|x_2(n)|^2)e^{j\varpi_1 nT} + \\ (x_2(n)|x_2(n)|^2 + 2x_2(n)|x_1(n)|^2)e^{j\varpi_2 nT} + \\ (x_1(n)^2 x_2(n)^*)e^{j(2\times\varpi_1-\varpi_2)nT} + \\ (x_2(n)^2 x_1(n)^*)e^{j(2\times\varpi_2-\varpi_1)nT} \end{pmatrix} +$$

$$c_5 \begin{pmatrix} \left(\begin{array}{c} x_1(n)|x_1(n)|^4 + 6x_1(n)|x_1(n)|^2|x_2(n)|^2 + \\ 3x_1(n)|x_2(n)|^4 \end{array}\right)e^{j\varpi_1 nT} + \\ \left(\begin{array}{c} x_2(n)|x_2(n)|^4 + 6x_2(n)|x_2(n)|^2|x_1(n)|^2 + \\ 3x_2(n)|x_1(n)|^4 \end{array}\right)e^{j\varpi_2 nT} + \\ \left(\begin{array}{c} 2x_1(n)^2|x_1(n)|^2 x_2(n)^* + \\ 3x_1(n)^2|x_2(n)|^2 x_2(n)^* \end{array}\right)e^{j(2\times\varpi_1-\varpi_2)nT} + \\ \left(\begin{array}{c} 2x_2(n)^2|x_2(n)|^2 x_1(n)^* + \\ 3x_2(n)^2|x_1(n)|^2 x_1(n)^* \end{array}\right)e^{j(2\times\varpi_2-\varpi_1)nT} \end{pmatrix}$$

Equation (22) can be re-written as four equations, one for each frequency band (including the two IM3 frequency bands), as follows:

$$y_1(n) = \quad (23)$$
$$\begin{pmatrix} c_1 x_1(n) + c_3 x_1(n)|x_1(n)|^2 + 2c_3 x_1(n)|x_2(n)|^2 + \\ c_5 x_1(n)|x_1(n)|^4 + 6c_5 x_1(n)|x_1(n)|^2|x_2(n)|^2 + 3c_5 x_1(n)|x_2(n)|^4 \end{pmatrix} \times e^{j\varpi_1 nT}$$

$$y_2(n) = \quad (24)$$
$$\begin{pmatrix} c_1 x_2(n) + c_3 x_2(n)|x_2(n)|^2 + 2c_3 x_2(n)|x_1(n)|^2 + \\ c_5 x_2(n)|x_2(n)|^4 + 6c_5 x_2(n)|x_2(n)|^2|x_1(n)|^2 + 3c_5 x_2(n)|x_1(n)|^4 \end{pmatrix} \times e^{j\varpi_2 nT}$$

$$y_3(n) = \begin{pmatrix} c_3 x_1(n)^2 x_2(n)^* + 2c_5 x_1(n)^2|x_1(n)|^2 x_2(n)^* + \\ 3c_5 x_1(n)^2|x_2(n)|^2 x_2(n)^* \end{pmatrix} \times e^{j(2\times\varpi_1-\varpi_2)nT} \quad (25)$$

-continued $$y_4(n) = \begin{pmatrix} c_3 x_2(n)^2 x_1(n)^* + 2c_5 x_2(n)^2 |x_2(n)|^2 x_1(n)^* + \\ 3c_5 x_2(n)^2 |x_1(n)|^2 x_1(n)^* \end{pmatrix} \times e^{j(2\times\omega_2 - \omega_1)nT} \quad (26)$$

One can notice in Equations (22)-(26) that the two frequency bands for the concurrent dual-band signal (i.e., the frequency bands centered at $\omega_1$ and $\omega_2$) and the two IM3 frequency bands (i.e., the frequency bands centered at $2\omega_1-\omega_2$, and $2\omega_2-\omega_1$) share the same set of coefficients and that only three coefficients ($c_1$, $c_3$, $c_5$) need to be calculated. As such, the new baseband model requires a reduced number of coefficients, which greatly simplifies the complexity of the DPD system and that of the concurrent dual-band transmitter.

Based on this knowledge that the same set of coefficients can be used for each of the frequency bands of the concurrent dual-band signal as well as each of the IM3 frequency bands, the inventors have developed a new baseband model that uses the same set of predistortion coefficients for each of the frequency bands of the concurrent dual-band signal as well as each of the IM3 frequency bands. Specifically, the new baseband model that also includes IM3 is defined as:

$$y_1(n) = \sum_{m=0}^{M-1}\sum_{k=0}^{N-1} c_{k,m} x_1(n-m) |a_{k+1}^{(inBand)} | x_1(n-m)| + j b_{k+1}^{(inBand)}|x_2(n-m)|\|^k \quad (27)$$

$$y_2(n) = \sum_{m=0}^{M-1}\sum_{k=0}^{N-1} c_{k,m} x_2(n-m) |a_{k+1}^{(inBand)} | x_2(n-m)| + j b_{k+1}^{(inBand)}|x_1(n-m)|\|^k \quad (28)$$

$$y_3(n) = \sum_{m=0}^{M-1}\sum_{k=0}^{N-1} c_{k,m} x_1(n-m)^2 x_2(n-m)^* |a_{k+1}^{(IM3)} | x_1(n-m)| + \quad (29)$$
$$j b_{k+1}^{(IM3)}|x_2(n-m)|\|^{k-1}$$

$$y_4(n) = \sum_{m=0}^{M-1}\sum_{k=0}^{N-1} c_{k,m} x_2(n-m)^2 x_1(n-m)^* |a_{k+1}^{(IM3)} | x_2(n-m)| + \quad (30)$$
$$j b_{k+1}^{(IM3)}|x_1(n-m)|\|^{k-1}$$

where $y_1(n)$ is the predistorted output signal of a digital predistorter for the first frequency band of the concurrent dual-band signal, $y_2(n)$ is the predistorted output signal of a digital predistorter for the second frequency band of the concurrent dual-band signal, $y_3(n)$ is the predistorted output signal of a digital predistorter for the first IM3 frequency band, $y_4(n)$ is the predistorted output signal of a digital predistorter for the second IM3 frequency band, M represents a memory depth of the new baseband model, N is the nonlinear order of the new baseband model (i.e., an order of nonlinearity compensated for by the digital predistorters), $c_{k,m}$ are complex valued predistortion coefficients for the digital predistorter for each of the frequency bands of the concurrent dual-band signal and each of the IM3 frequency bands, $x_1$ is the digital input signal for the first band, $x_2$ is the digital input signal for the second band, $a_{k+1}^{inBand}$ and $b_{k+1}^{inBand}$ are pre-calculated (k+1)-th order envelope coupling factors between $x_1$ and $x_2$ for frequency bands of the concurrent dual-band signal, and $a_{k+1}^{IM3}$ and $b_{k+1}^{IM3}$ are pre-calculated (k+1)-th order envelope coupling factors between $x_1$ and $x_2$ for the IM3 frequency bands. Importantly, the set of predistortion coefficients $c_{k,m}$ is the same for each of the frequency bands and each of the IM3 frequency bands. In other words, the same set of predistortion coefficients $c_{k,m}$ is used to configure each of the digital predistorters. The envelope coupling factors $a_{k+1}^{inBand}$ and $b_{k+1}^{inBand}$ as well as the envelope coupling factors $a_{k+1}^{IM3}$ and $b_{k+1}^{IM3}$ can be calculated using the process described above with respect to the envelope coupling factors $a_{k+1}$ and $b_{k+1}$.

FIG. 8 illustrates one embodiment of the concurrent dual-band transmitter 34 that utilizes the new baseband model that further compensates for IM3 according to one embodiment of the present disclosure. In this embodiment, the digital predistortion subsystem 40 further includes digital predistorters 72-1 and 72-2 that process the up-sampled digital input signals to provide predistorted digital input signals that compensate for IM3 in frequency bands centered at $2\omega_1-\omega_2$ and $2\omega_2-\omega_1$, respectively. As discussed below, the new baseband model can be further defined such that the same set of predistortion coefficients is utilized by both the digital predistorters 42-1 and 42-2 and the digital predistorters 72-1 and 72-2. The concurrent dual-band transmitter 34 also includes upconversion circuitry 74-1 and 74-2 configured to up-convert the predistorted digital input signals output by the digital predistorters 72-1 and 72-2 to $2\omega_1-\omega_2$ and $2\omega_2-\omega_1$, respectively. The up-converted signals from the upconversion circuitries 74-1 and 74-2 are then combined along with the up-converted signals from the upconversion circuitries 44-1 and 44-2 for the two frequency bands of the concurrent multi-band signal to provide the predistorted combined signal at the output of the combining circuitry 46. The predistorted combined signal is then quadrature modulated to provide the concurrent dual-band input signal, which is then amplified by the power amplifier circuitry 50 to provide the concurrent dual-band signal.

An adaptation system 76 of the concurrent dual-band transmitter 34 adaptively configures the digital predistorters 42-1, 42-2, 72-1, and 72-2 based on the new baseband model that further compensates for IM3. Specifically, as illustrated in FIG. 9, the adaptation system 76 includes the observation receiver 52 and the adaptor 54. The observation receiver 52 includes the attenuator 56, the filters 58-1 and 58-2, the downconversion and demodulation circuitry 60-1 and 60-2, and the combining circuitry 62 as discussed above. However, in this embodiment, the observation receiver 52 also includes filters 78-1 and 78-2, downconversion and demodulation circuitry 80-1 and 80-2, combining circuitry 82-1 and 82-2, and adjustment circuitry 84-1 and 84-2. In operation, the input of the attenuator 56 is coupled to the output of the power amplifier circuitry 50. The attenuator 56 attenuates the concurrent dual-band signal. The filters 58-1 and 58-2 filter the attenuated concurrent dual-band signal to provide feedback signals for the two frequency bands of the concurrent dual-band signal centered at $\omega_1$ and $\omega_2$, as discussed above. The filter 78-1 filters the attenuated concurrent dual-band signal to provide a feedback signal for the IM3 frequency band centered at $2\omega_1-\omega_2$. Likewise, the filter 78-2 filters the attenuated concurrent dual-band signal to provide a feedback signal for the IM3 frequency band centered at $2\omega_2-\omega_1$.

The downconversion and demodulation circuitry 60-1 downconverts and demodulates the feedback signal for the first frequency band of the concurrent dual-band signal (i.e., the frequency band centered at $\omega_1$) to provide a digital baseband feedback signal for the first frequency band. Likewise, the downconversion and demodulation circuitry 60-2 downconverts and demodulates the feedback signal for the second frequency band of the concurrent dual-band signal (i.e., the frequency band centered at $\omega_2$) to provide a digital baseband feedback signal for the second frequency band. Conversely, the downconversion and demodulation circuitry 80-1 downconverts and demodulates the feedback signal for the first IM3 frequency band (i.e., the IM3 frequency band centered at $2\omega_1-\omega_2$) to provide a digital feedback signal for the first IM3 frequency band at a first intermediate frequency (−IF1). In a similar manner, the downconversion and demodulation circuitry 80-2 downconverts and demodulates the feedback signal for the second IM3 frequency band (i.e., the IM3 frequency band centered at $2\omega_2-\omega_1$) to provide a digital feedback signal for the second IM3 frequency band at a second intermediate frequency (+IF2).

Next, the combining circuitry 82-1 combines the digital feedback signal for the first IM3 frequency band and the digital baseband feedback signal for the first frequency band of the concurrent dual-band signal to provide a first combined signal. Likewise, the combining circuitry 82-2 combines the digital feedback signal for the second IM3 frequency band and the digital baseband feedback signal for the second frequency band of the concurrent dual-band signal to provide a second combined signal. The adjustment circuitry 84-1 performs time, phase, and/or gain adjustments for the first combined signal relative to a first reference signal, which as illustrated in FIG. 8 is the up-sampled digital input signal for the first frequency band. Likewise, the adjustment circuitry 84-2 performs time, phase, and/or gain adjustments for the second combined signal relative to a second reference signal, which as illustrated in FIG. 8 is the up-sampled digital input signal for the second frequency band. The combining circuitry 62 then combines the adjusted first and second combined signals to provide a combined digital feedback signal for the concurrent dual-band signal.

Importantly, as illustrated with respect to the combined digital feedback signal at the output of the combining circuitry 62 in FIG. 9, the first and second intermediate frequencies (−IF1 and +IF2) are selected such that the IM3 frequency bands (C and D) in the combined digital feedback signal do not overlap with a combined frequency band (A+B) for the first frequency band (A) and the second frequency band (B) in the combined digital feedback signal. The values of IF1 and IF2 are determined by the signal bandwidths as well as the nonlinear order of the DPD system. More specifically, as illustrated in FIG. 10, the bandwidth of the combined baseband signal A+B is:

$$N \times \max(BW_1, BW_2) \quad (31)$$

where N is the order of nonlinearity, $BW_1$ is the bandwidth of the digital input signal for the first frequency band, and $BW_2$ is the bandwidth of the digital input signal for the first frequency band, the bandwidth of the C band is:

$$2 \times BW_1 + BW_2 + (N-3) \times \max(BW_1, BW_2), \text{ and} \quad (32)$$

the bandwidth of the D band is:

$$BW_1 + 2 \times BW_2 + (N-3) \times \max(BW_1, BW_2). \quad (33)$$

Therefore, minimum values for the intermediate frequencies IF1 and IF2 are given by:

$$IF1 = \frac{2 \times BW_1 + BW_2 + (2N-3) \times \max(BW_1 + BW_2)}{2} \quad (34)$$

$$IF2 = \frac{BW_1 + 2 \times BW_2 + (2N-3) \times \max(BW_1 + BW_2)}{2} \quad (35)$$

Note, however, that the intermediate frequencies IF1 and IF2 can be greater than the values defined by Equations (34) and (35), but are preferably substantially less than values at which the bandwidth of the combined feedback signal is equal to the total bandwidth of the concurrent dual-band signal including the IM3 frequency bands.

Returning to FIG. 9, the two reference signals (REF 1 and REF 2), which in this embodiment are the up-sampled digital input signals, are combined by combining circuitry 86 to provide a combined reference signal. Combining circuitry 88 receives the combined reference signal and the combined feedback signal and outputs an error signal (e) that is a difference between the combined reference signal and the combined feedback signal. The adaptor 54 then adaptively configures the set of predistortion coefficients $c_{k,m}$ using any suitable adaptation algorithm (e.g., LMS) to minimize the error signal or, in other words, to minimize the difference between the combined reference signal and the combined feedback signal. Again, the adaptor 54 adaptively configures a single set of predistortion coefficients $c_{k,m}$, which according to the new baseband model is utilized by each of the digital predistorters 42-1, 42-2, 72-1, and 72-2.

It should be noted that the discussion herein focuses on new baseband models for the dual-band scenario. However, it should be appreciated that the new baseband models disclosed herein can be extended to more than two frequency bands and to higher order intermodulation bands if desired. Also, the DPD architectures disclosed herein utilize a direct learning adaptation technique. However, as will be appreciated by one of ordinary skill in the art upon reading this disclosure, indirect learning adaptation techniques may alternatively be used.

The following acronyms are used throughout this disclosure.
2D-DPD Dual-Band Digital Predistortion
2D-MMP 2D-Modified Memory Polynomial
A/D Analog-to-Digital
BB Baseband
DPD Digital Predistortion
IM3 Third-Order Intermodulation
LMS Least Mean Squares
LTE Long Term Evolution
PA Power Amplifier
PD Predistorter Those skilled in the art will recognize improvements and modifications to the preferred embodiments of the present disclosure. All such improvements and modifications are considered within the scope of the concepts disclosed herein and the claims that follow.

What is claimed is:

1. A concurrent multi-band transmitter, comprising:
   a digital predistortion subsystem comprising a plurality of digital predistorters configured to process a plurality of digital input signals for a plurality of frequency bands of a concurrent multi-band signal to provide a plurality of predistorted digital input signals each being for a different one of the plurality of frequency bands of the concurrent multi-band signal, wherein each digital predistorter of the plurality of digital predistorters is configured to process the plurality of digital input signals based on a set of predistortion coefficients to provide a different one of the plurality of predistorted digital input signals;
   circuitry configured to process the plurality of predistorted digital input signals to provide a predistorted concurrent multi-band signal;
   power amplifier circuitry configured to amplify the predistorted concurrent multi-band signal to provide the concurrent multi-band signal; and
   a single adaptor configured to adaptively configure the set of predistortion coefficients for each of the plurality of digital predistorters based on a digital baseband model of the plurality of digital predistorters that is based on a memory polynomial and has a same set of predistortion coefficients for each of the plurality of digital predistorters.

2. The concurrent multi-band transmitter of claim 1 wherein:
the concurrent multi-band signal is a concurrent dual-band signal having two frequency bands such that the plurality of digital input signals is two digital input signals for the two frequency bands of the concurrent dual-band signal, the plurality of digital predistorters is two digital predistorters for the two frequency bands of the concurrent dual-band signal, and the plurality of predistorted digital input signals is two predistorted digital input signals for the two frequency bands of the concurrent dual-band signal; and
the digital baseband model of the two digital predistorters for N-th order nonlinearities and M-th order memory depth is represented as:

$$y_1(n) = \sum_{m=0}^{M-1} \sum_{k=0}^{N-1} c_{k,m} x_1(n-m) |a_{k+1}|x_1(n-m)| + jb_{k+1}|x_2(n-m)||_k$$

$$y_2(n) = \sum_{m=0}^{M-1} \sum_{k=0}^{N-1} c_{k,m} x_2(n-m) |a_{k+1}|x_2(n-m)| + jb_{k+1}|x_1(n-m)||_k$$

where $y_1(n)$ denotes the predistorted digital input signal generated by a first of the two digital predistorters for a first frequency band of the two frequency bands of the concurrent dual-band signal, $y_2(n)$ denotes the predistorted digital input signal generated by a second of the two digital predistorters for a second frequency band of the two frequency bands of the concurrent dual-band signal, $x_1(n)$ denotes a first digital input signal of the two digital input signals for the two frequency bands of the concurrent dual-band signal, $x_2(n)$ denotes a second digital input signal of the two digital input signals for the two frequency bands of the concurrent dual-band signal, $c_{k,m}$ for k=0, . . . N-1 and m=0, . . . , M-1 is the set of predistortion coefficients for both of the two digital predistorters, and $a_{k+1}$ and $b_{k+1}$ for k=0, . . . N-1 are predetermined envelope coupling factors between $x_1(n)$ and $x_2(n)$.

3. The concurrent multi-band transmitter of claim 1 wherein the plurality of digital input signals is a plurality of digital baseband input signals, and the concurrent multi-band transmitter further comprises:
combiner circuitry configured to combine the plurality of digital baseband input signals to provide a combined reference signal; and
wherein the single adaptor is configured to adaptively configure the set of predistortion coefficients based on the combined reference signal.

4. The concurrent multi-band transmitter of claim 3 further comprising:
an observation receiver coupled to an output of the power amplifier circuitry and configured to output a combined feedback signal in which each frequency band of the concurrent multi-band signal output by the power amplifier circuitry is downconverted to baseband;
wherein the single adaptor is configured to adaptively configure the set of predistortion coefficients based on the combined reference signal and the combined feedback signal.

5. The concurrent multi-band transmitter of claim 1 further comprising:

tuning circuitry configured to tune each digital input signal of the plurality of digital input signals to a different intermediate frequency to thereby provide a plurality of tuned digital input signals; and
combiner circuitry configured to combine the plurality of tuned digital input signals to provide a combined reference signal;
wherein the single adaptor is configured to adaptively configure the set of predistortion coefficients based on the combined reference signal.

6. The concurrent multi-band transmitter of claim 5 further comprising:
an observation receiver coupled to an output of the power amplifier circuitry and configured to output a combined feedback signal in which each frequency band of the concurrent multi-band signal output by the power amplifier circuitry is tuned a same intermediate frequency as a corresponding one of the plurality of digital input signals in the combined reference signal;
wherein the single adaptor is configured to adaptively configure the set of predistortion coefficients based on the combined reference signal and the combined feedback signal.

7. The concurrent multi-band transmitter of claim 6 wherein the different intermediate frequencies have sufficient separation to avoid overlap of the frequency bands of the concurrent multi-band signal in the combined feedback signal for at least up to a predefined maximum order of nonlinearity for which the plurality of digital predistorters compensate.

8. The concurrent multi-band transmitter of claim 1 wherein:
the digital predistortion subsystem comprises a second plurality of digital predistorters configured to compensate for third-order intermodulation bands, each of the second plurality of digital predistorters being configured based on the same set of predistortion coefficients as each of the plurality of digital predistorters.

9. The concurrent multi-band transmitter of claim 8 wherein the single adaptor is configured to adaptively configure the set of predistortion coefficients for each of the plurality of digital predistorters and each of the second plurality of digital predistorters based on a digital baseband model of the plurality of digital predistorters and the second plurality of digital predistorters that is based on a memory polynomial and has a same set of predistortion coefficients for each of the plurality of digital predistorters and each of the second plurality of digital predistorters.

10. The concurrent multi-band transmitter of claim 9 wherein:
the concurrent multi-band signal is a concurrent dual-band signal having two frequency bands such that the plurality of digital input signals is two digital input signals for the two frequency bands of the concurrent dual-band signal, the plurality of digital predistorters is two digital predistorters for the two frequency bands of the concurrent dual-band signal, the plurality of predistorted digital input signals is two predistorted digital input signals for the two frequency bands of the concurrent dual-band signal, and the second plurality of digital predistorters is two additional digital predistorters for two third-order intermodulation distortion frequency bands; and
the digital baseband model of the two digital predistorters for the two frequency bands of the concurrent dual-band signal and the two additional digital predistorters for the two third-order intermodulation distortion frequency bands for N-th order nonlinearities and M-th order memory depth is represented as:

$$y_1(n) = \sum_{m=0}^{M-1}\sum_{k=0}^{N-1} c_{k,m} x_1(n-m) |a_{k+1}^{(inBand)}| x_1(n-m)| + jb_{k+1}^{(inBand)}|x_2(n-m)|\|^k$$

$$y_2(n) = \sum_{m=0}^{M-1}\sum_{k=0}^{N-1} c_{k,m} x_2(n-m) |a_{k+1}^{(inBand)}| x_2(n-m)| + jb_{k+1}^{(inBand)}|x_1(n-m)|\|^k$$

$$y_3(n) = \sum_{m=0}^{M-1}\sum_{k=0}^{N-1} c_{k,m} x_1(n-m)^2 x_2(n-m)^* |a_{k+1}^{(IM3)}| x_1(n-m)| +$$
$$jb_{k+1}^{(IM3)}|x_2(n-m)|\|^{k-1}$$

$$y_4(n) = \sum_{m=0}^{M-1}\sum_{k=0}^{N-1} c_{k,m} x_2(n-m)^2 x_1(n-m)^* |a_{k+1}^{(IM3)}| x_2(n-m)| +$$
$$jb_{k+1}^{(IM3)}|x_1(n-m)|\|^{k-1}$$

where $y_1(n)$ denotes the predistorted digital input signal generated by a first of the two digital predistorters for a first frequency band of the two frequency bands of the concurrent dual-band signal, $y_2(n)$ denotes the predistorted digital input signal generated by a second of the two digital predistorters for a second frequency band of the two frequency bands of the concurrent dual-band signal, $y_3(n)$ denotes a predistorted digital input signal generated by a first of the two additional digital predistorters for a first third-order intermodulation distortion frequency band of the two third-order intermodulation distortion frequency bands, $y_4(n)$ denotes a predistorted digital input signal generated by a second of the two additional digital predistorters for a second third-order intermodulation distortion frequency band of the two third-order intermodulation distortion frequency bands, $x_1(n)$ denotes a first digital input signal of the two digital input signals for the two frequency bands of the concurrent dual-band signal, $x_2(n)$ denotes a second digital input signal of the two digital input signals for the two frequency bands of the concurrent dual-band signal, $c_{k,m}$ for k=0, ... N−1 and m=0, ... , M−1 is the set of predistortion coefficients for both of the two digital predistorters and both of the two additional digital predistorters, $a_{k+1}^{(inBand)}$ and $b_{k+1}^{(inBand)}$ for k=0, ... N−1 are predetermined envelope coupling factors between $x_1(n)$ and $x_2(n)$ for the two digital predistorters for the two frequency bands of the concurrent dual-band signal, and $a_{k+1}^{(IM3)}$ and $b_{k+1}^{(IM3)}$ for k=0, ... N−1 are predetermined envelope coupling factors between $x_1(n)$ and $x_2(n)$ for the two additional digital predistorters for the two third-order intermodulation distortion frequency bands.

11. The concurrent multi-band transmitter of claim 9 wherein the plurality of digital input signals is a plurality of digital baseband input signals, and the concurrent multi-band transmitter further comprises:
   combiner circuitry configured to sum the plurality of digital baseband input signals to provide a combined reference signal; and
   wherein the single adaptor is configured to adaptively configure the set of predistortion coefficients based on the combined reference signal.

12. The concurrent multi-band transmitter of claim 11 further comprising:
   an observation receiver coupled to an output of the power amplifier circuitry and configured to output a combined feedback signal in which each frequency band of the concurrent multi-band signal output by the power amplifier circuitry is downconverted to baseband and each third-order intermodulation distortion frequency band is tuned to a different intermediate frequency;
   wherein the single adaptor is configured to adaptively configure the set of predistortion coefficients based on the combined reference signal and the combined feedback signal.

13. The concurrent multi-band transmitter of claim 12 wherein the different intermediate frequencies are selected such that, after downconversion of the plurality of frequency bands of the concurrent multi-band signal to baseband and tuning of a plurality of third-order intermodulation distortion frequency bands to the different intermediate frequencies, the plurality of third-order intermodulation distortion frequency bands do not overlap with the plurality of frequency bands of the concurrent multi-band signal in the combined feedback signal.

14. A method of operation of a concurrent multi-band transmitter, comprising:
   processing a plurality of digital input signals for a plurality of frequency bands of a concurrent multi-band signal via a plurality of digital predistorters to provide a plurality of predistorted digital input signals each being for a different one of the plurality of frequency bands of the concurrent multi-band signal, wherein each digital predistorter of the plurality of digital predistorters is configured to process the plurality of digital input signals based on a set of predistortion coefficients to provide a different one of the plurality of predistorted digital input signals;
   processing the plurality of predistorted digital input signals to provide a predistorted concurrent multi-band signal;
   amplifying the predistorted concurrent multi-band signal to provide the concurrent multi-band signal; and
   adaptively configuring the set of predistortion coefficients for each of the plurality of digital predistorters via a single adaptor based on a digital baseband model of the plurality of digital predistorters that is based on a memory polynomial and has a same set of predistortion coefficients for each of the plurality of digital predistorters.

15. The method of claim 14 wherein:
   the concurrent multi-band signal is a concurrent dual-band signal having two frequency bands such that the plurality of digital input signals is two digital input signals for the two frequency bands of the concurrent dual-band signal, the plurality of digital predistorters is two digital predistorters for the two frequency bands of the concurrent dual-band signal, and the plurality of predistorted digital input signals is two predistorted digital input signals for the two frequency bands of the concurrent dual-band signal; and
   the digital baseband model of the two digital predistorters for N-th order nonlinearities and M-th order memory depth is represented as:

$$y_1(n) = \sum_{m=0}^{M-1}\sum_{k=0}^{N-1} c_{k,m} x_1(n-m) |a_{k+1}| x_1(n-m)| + jb_{k+1}|x_2(n-m)|\|_k$$

$$y_2(n) = \sum_{m=0}^{M-1}\sum_{k=0}^{N-1} c_{k,m} x_2(n-m) |a_{k+1}| x_2(n-m)| + jb_{k+1}|x_1(n-m)|\|_k$$

where $y_1(n)$ denotes the predistorted digital input signal generated by a first of the two digital predistorters for a first frequency band of the two frequency bands of the concurrent dual-band signal, $y_2(n)$ denotes the predistorted digital input signal generated by a second of the two digital predistorters for a second frequency band of the two frequency bands of the concurrent dual-band signal, $x_1(n)$ denotes a first digital input signal of the two digital input signals for the two frequency bands of the concurrent dual-band signal, $x_2(n)$ denotes a second digital input signal of the two digital input signals for the two frequency bands of the concurrent dual-band signal, $c_{k,m}$ for k=0, ... N−1 and m=0, ... , M−1 is the set of predistortion coefficients for both of the two digital predistorters, and $a_{k+1}$ and $b_{k+1}$ for k=0, ... N−1 are predetermined envelope coupling factors between $x_1(n)$ and $x_2(n)$.

16. The method of claim 14 wherein the plurality of digital input signals is a plurality of digital baseband input signals, and the method further comprises:
   combining the plurality of digital baseband input signals to provide a combined reference signal;
   wherein adaptively configuring the set of predistortion coefficients for each of the plurality of digital predistorters comprises adaptively configuring the set of predistortion coefficients of the digital baseband model based on the combined reference signal.

17. The method of claim 16 further comprising:
   processing the concurrent multi-band signal to provide a combined feedback signal in which each frequency band of the concurrent multi-band signal output by power amplifier circuitry is downconverted to baseband;
   wherein adaptively configuring the set of predistortion coefficients for each of the plurality of digital predistorters comprises adaptively configuring the set of predistortion coefficients of the digital baseband model based on the combined reference signal and the combined feedback signal.

18. The method of claim 14 further comprising processing the plurality of digital input signals via a second plurality of digital predistorters to provide a plurality of additional predistorted digital input signals that compensate for third-order intermodulation distortion, wherein each of the second plurality of digital predistorters being configured based on the same set of predistortion coefficients as each of the plurality of digital predistorters.

* * * * *

UNITED STATES PATENT AND TRADEMARK OFFICE
CERTIFICATE OF CORRECTION

PATENT NO. : 9,252,718 B2
APPLICATION NO. : 13/969858
DATED : February 2, 2016
INVENTOR(S) : Laporte et al.

It is certified that error appears in the above-identified patent and that said Letters Patent is hereby corrected as shown below:

In The Specification

In Column 7, Line 31, in Equation (6), delete "$x(n)=x_1(n)\times e^{j\omega_1 nT}+x_2(n)\times e^{j\omega_2 nT}$" and insert -- $x(n)=x_1(n)\times e^{j\omega_1 nT}+x_2(n)\times e^{j\omega_2 nT}$ --, therefor.

In The Claims

In Column 22, Lines 58-59, in Claim 15, delete "$\||x_2(n\;\;m)|\|_k$" and insert -- $\||x_2(n-m)|\|^k$ --, therefor.

In Column 22, Lines 61-62, in Claim 15, delete "$\||x_1(n-m)|\|_k$" and insert -- $\||x_1(n-m)|\|^k$ --, therefor.

Signed and Sealed this
Twelfth Day of July, 2016

Michelle K. Lee
*Director of the United States Patent and Trademark Office*